(12) United States Patent
Um et al.

(10) Patent No.: US 11,587,598 B2
(45) Date of Patent: Feb. 21, 2023

(54) MEMORY DEVICE FOR GENERATING PULSE AMPLITUDE MODULATION-BASED DQ SIGNAL AND MEMORY SYSTEM INCLUDING THE SAME

(71) Applicant: SAMSUNG ELECTRONICS CO., LTD., Suwon-si (KR)

(72) Inventors: Youngdo Um, Hwaseong-si (KR); Younghoon Son, Yongin-si (KR); Youngdon Choi, Seoul (KR); Jindo Byun, Suwon-si (KR); Hyunyoon Cho, Uiwang-si (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/385,002

(22) Filed: Jul. 26, 2021

(65) Prior Publication Data

US 2022/0076716 A1    Mar. 10, 2022

(30) Foreign Application Priority Data

Sep. 9, 2020  (KR) .................. 10-2020-0115693
Dec. 24, 2020 (KR) .................. 10-2020-0183520

(51) Int. Cl.
*H04B 1/00* (2006.01)
*G11C 7/10* (2006.01)
*H04L 25/49* (2006.01)

(52) U.S. Cl.
CPC ........ *G11C 7/1048* (2013.01); *H04L 25/4917* (2013.01); *G11C 2207/2254* (2013.01)

(58) Field of Classification Search
CPC ............ G06F 13/1689; G06F 13/4295; G06F 3/0604; H04L 1/0061; H04L 1/0042; H04L 2001/0094; H04L 25/49; H04L 25/4917; H04N 7/04
USPC ........................................................ 375/146
See application file for complete search history.

(56) References Cited

U.S. PATENT DOCUMENTS

| | | |
|---|---|---|
| 6,772,351 B1 | 8/2004 | Werner et al. |
| 9,509,535 B2 | 11/2016 | Hollis |
| 9,568,934 B2 | 2/2017 | Hong |
| 9,911,469 B1 | 3/2018 | Hollis et al. |
| 10,283,187 B2 | 5/2019 | Hollis et al. |
| 10,312,896 B2 | 6/2019 | Kim et al. |
| 10,404,505 B1 | 9/2019 | Wilson |

(Continued)

OTHER PUBLICATIONS

Communication dated Feb. 2, 2022, issued by the European Patent Office in counterpart European Application No. 21195626.3.

*Primary Examiner* — Khai Tran
(74) *Attorney, Agent, or Firm* — Sughrue Mion, PLLC

(57) ABSTRACT

A memory device includes a memory cell array and a transmitter, wherein the transmitter includes a pulse amplitude modulation (PAM) encoder configured to generate a PAM-n first input signal (where n is an integer greater than or equal to 4) from data read from the memory cell array; a pre-driver configured to generate a second input signal based on the first input signal and based on a calibration code signal, and output the second input signal using a first power voltage; and a driver configured to output a PAM-n DQ signal using a second power voltage lower than the first power voltage in response to the second input signal.

19 Claims, 46 Drawing Sheets

(56) References Cited

U.S. PATENT DOCUMENTS

| | | |
|---|---|---|
| 10,447,512 B2 | 10/2019 | Lin et al. |
| 10,566,968 B1 | 2/2020 | Son et al. |
| 10,740,264 B1 * | 8/2020 | Benedict ............... G06F 3/0673 |
| 2013/0343471 A1 | 12/2013 | Suzuki et al. |
| 2014/0159769 A1 | 6/2014 | Hong et al. |
| 2018/0076836 A1 | 3/2018 | Zhu et al. |
| 2019/0394071 A1 | 12/2019 | Farzan et al. |
| 2021/0241818 A1 * | 8/2021 | Lee ....................... G11C 11/565 |
| 2021/0242870 A1 * | 8/2021 | Kim ................... H03K 19/0005 |

* cited by examiner

1

MEMORY DEVICE FOR GENERATING PULSE AMPLITUDE MODULATION-BASED DQ SIGNAL AND MEMORY SYSTEM INCLUDING THE SAME

CROSS-REFERENCE TO RELATED APPLICATIONS

This application is based on and claims priority under 35 U.S.C. § 119 to Korean Patent Application Nos. 10-2020-0115693 and 10-2020-0183520, filed on Sep. 9, 2020 and Dec. 24, 2020, respectively, in the Korean Intellectual Property Office, the disclosures of which are incorporated by reference herein in their entireties.

BACKGROUND

The disclosure relates to a memory device, and more particularly, to a memory device for generating a pulse amplitude modulation-based DQ signal and a memory system including the memory device.

As mobile devices are rapidly distributed and Internet access rapidly increases, demand for high-capacity and high-speed data transmission has been increasing. Accordingly, in a memory system, a technique for storing high-capacity data and high-speed data transmission in response to a data request is necessary. However, according to a signal modulation method based on a non-return to zero (NRZ)-type encoding, it is difficult to satisfy the demand for the high-capacity and high-speed data transmission. Recently, in a memory system, research into a pulse amplitude modulation (PAM) method has been actively performed as an alternative for a signaling method for high-capacity and high-speed data transmission.

SUMMARY

The disclosure provides a memory device for improving data transmission performance in a high frequency band of the memory device generating a DQ signal of a pulse amplitude modulation method and efficiently improving power consumption, and a memory system including the memory device.

In accordance with an aspect of the disclosure, a memory device includes a memory cell array; and a transmitter, wherein the transmitter includes a pulse amplitude modulation (PAM) encoder configured to generate a PAM-n first input signal (where n is an integer greater than or equal to 4) from data read from the memory cell array; a pre-driver configured to generate a second input signal based on the first input signal and based on a calibration code signal, and output the second input signal using a first power voltage; and a driver configured to output a PAM-n DQ signal using a second power voltage lower than the first power voltage in response to the second input signal.

In accordance with an aspect of the disclosure, a memory device includes a memory cell array; and a transmitter, wherein the transmitter includes a pulse amplitude modulation (PAM) encoder configured to generate a first most significant bit (MSB) signal and a second MSB signal in accordance with a PAM-4 and generate a first least significant bit (LSB) signal and a second LSB signal from data read from the memory cell array; a pre-driver configured to, in a first voltage domain, generate a third MSB signal based on the first MSB signal and a first pull-up code, a fourth MSB signal based on the second MSB signal and a second pull-up code, a third LSB signal based on the first LSB signal and a first pull-down code, and a fourth LSB signal based on the second LSB signal and a second pull-down code; and a driver including a first pull-up circuit activated by the third MSB signal and configured to adjust a driving strength by the third MSB signal, a first pull-down circuit activated by the fourth MSB signal and configured to adjust the driving strength based on the fourth MSB signal, a second pull-up circuit activated by the third LSB signal and configured to adjust the driving strength based on the third LSB signal, and a second pull-down circuit activated by the fourth LSB signal and configured to adjust the driving strength based on the fourth LSB signal, and configured to output a DQ signal based on the PAM-4 using the first pull-up circuit, the second pull-up circuit, the first pull-down circuit, and the second pull-down circuit in a second voltage domain.

In accordance with an aspect of the disclosure, a memory system includes a memory controller; and a plurality of memory devices connected to the memory controller through one channel, wherein each of the plurality of memory devices includes a transmitter including a pulse amplitude modulation (PAM) encoder configured to generate a first input signal in accordance with a PAM-n (where n is an integer greater than or equal to 4) from data requested by the memory controller; a pre-driver configured to generate a second input signal based on the first input signal and based on a calibration code signal, and output the second input signal using a first power voltage; and a driver configured to output a DQ signal based on the PAM-n using a second power voltage lower than the first power voltage in response to the second input signal.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION OF EMBODIMENTS

Hereinafter, one or more embodiments will be described in detail with reference to accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
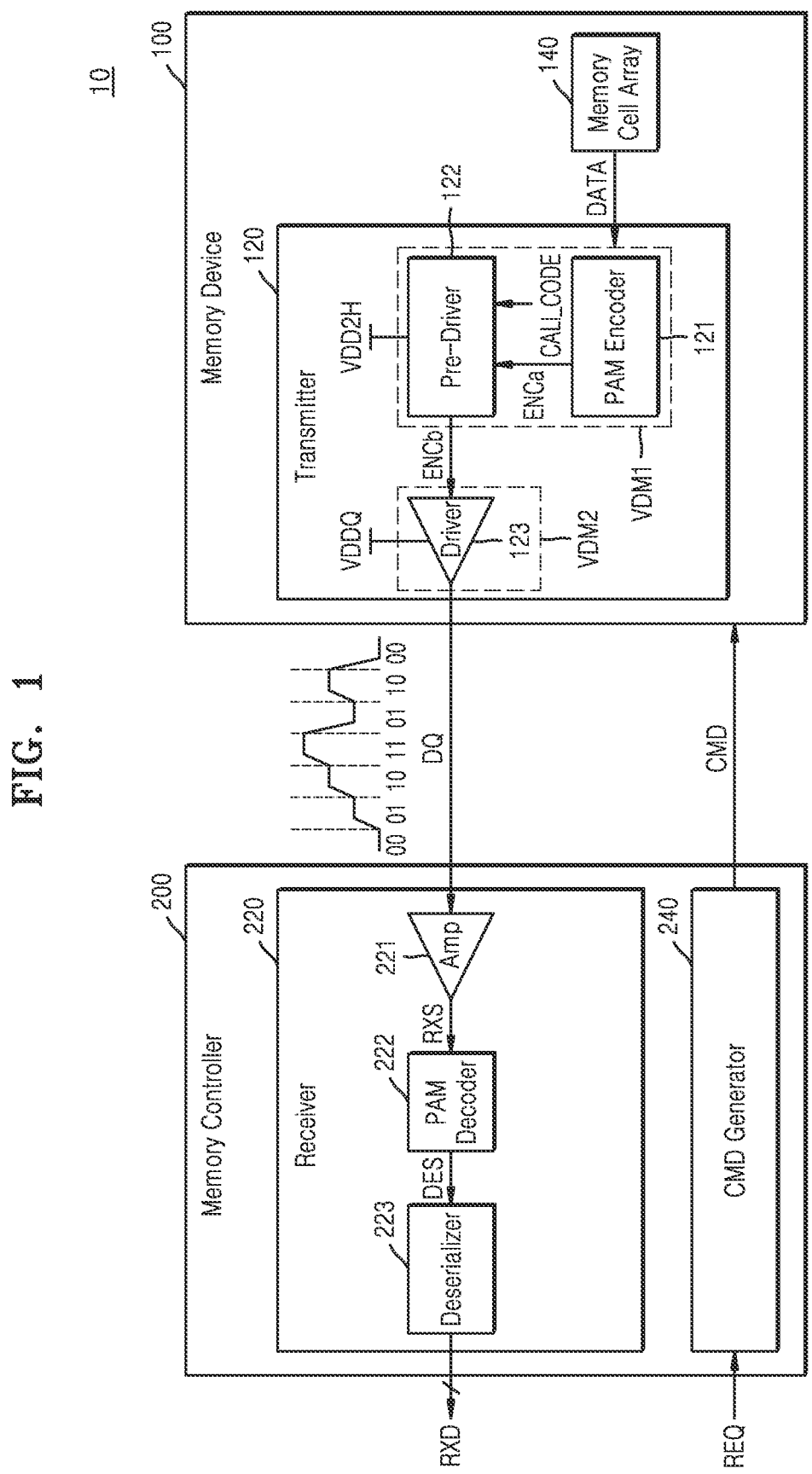
FIG. 1 is a block diagram of a memory system according to an embodiment.

FIG. 1 is a block diagram of a memory system 10 according to an embodiment. In the embodiments described below, dynamic random access memory (DRAM), that is, a volatile memory, is shown as a memory device 100 included in the memory system 10, but one or more embodiments are not limited thereto. For example, the memory device 100 may be another kind of volatile memory. Alternatively, the memory device according to one or more embodiments may include a non-volatile memory such as a resistive memory device, a flash memory device, etc.

Referring to FIG. 1, the memory system 10 may include the memory device 100 and a memory controller 200. The memory device 100 may include a transmitter 120 and a memory cell array 140. The memory controller 200 may include a receiver 220 and a command generator 240.

The transmitter 120 according to the embodiment may include a pulse amplitude modulation (PAM) encoder 121, a pre-driver 122, and a driver 123. The transmitter 120 may generate and output a DQ signal DQ including symbols of a bits according to n-level pulse amplitude modulation (PAM-n) and representing $2^a (=n)$ data values. For example, the transmitter 120 may generate and output the DQ signal DQ including symbols of 2 bits according to PAM-4 and representing four data values (00, 01, 10, and 11). In FIG. 1, the DQ signal DQ is implemented as a single signal to be transmitted/received through a single line between the memory device 100 and the memory controller 200. In some embodiments, the DQ signal DQ may be implemented as a differential signal and transmitted/received through differential lines between the memory device 100 and the memory controller 200.

Meanwhile, when the memory device 100 transmits the DQ signal DQ, an eye-opening height and an eye-opening width of the DQ signal DQ need to be sufficiently ensured in a high frequency band, and simultaneously, an efficient power consumption may be necessary. The driver 123 of the transmitter 120 according to an embodiment may output the DQ signal DQ having an improved linearity and sufficient eye-opening height and eye-opening width secured by using a power voltage lower than a power voltage supplied to another logic of the transmitter 120.

The command generator 240 of the memory controller 200 may generate and provide a command CMD, to the memory device 100, for controlling the memory operation in response to a request REQ transmitted from a host. In an embodiment, the memory controller 200 may transmit, to the memory device 100, at least one of a first setting signal indicating a type of a termination element of the memory controller 200 and a second setting signal for setting a signaling mode (or a transmission mode) of the transmitter 120 of the memory device 100. The memory controller 200 may transmit at least one of the first and second setting signals to the memory device 100 via a pin for transmitting the command CMD, a pin for transmitting an address, or a separate pin. In an embodiment, when the memory device 100 is a DRAM device, the memory controller 200 may generate a mode register set signal including at least one of the first and second setting signals and may provide the mode register set signal to the memory device 100.

When the command CMD is a read command, the transmitter 120 may receive read data DATA from the memory cell array 140. The PAM encoder 121 may encode the read data DATA based on a PAM-n method to generate encoding data (hereinafter referred to as a first input signal) ENCa and may provide the first input signal ENCa to the pre-driver 122. The pre-driver 122 may generate a second input signal ENCb based on the first input signal ENCa and a calibration code signal CALI_CODE, and may output the second input signal ENCb to the driver 123. The calibration code signal CALI_CODE may be defined as a signal including a plurality of codes for adjusting driving strength of each of a plurality of pull-up circuits and a plurality of pull-down circuits included in the driver 123. The second input signal ENCb is generated through a certain operation between the first input signal ENCa and the calibration code signal CALI_CODE, and the certain operation may vary according to the configuration of the driver 123. In an embodiment, the PAM encoder 121 and the pre-driver 122 may operate by receiving a first power voltage VDD2H. The PAM encoder 121 and the pre-driver 122 may be defined as operating in a first voltage domain VDM1. In an embodiment, the driver 123 may output the DQ signal DQ based on PAM-n using the second power voltage VDDQ lower than the first power voltage VDD2H in response to the second input signal ENCb. The driver 123 may be defined as operating in a second voltage domain VDM2. In an embodiment, the first power voltage VDD2H and the second power voltage VDDQ may follow details specified in the LPDDR5 standard specification, and accordingly, the first power voltage VDD2H may be set to 1.05 (V), and the second power voltage VDDQ may be set to 0.5 (V). In some embodiments, the first power voltage may be set to "VDD2L" of a level lower than that of "VDD2H" defined in the LPDDR5 standard specification. However, the disclosure is not limited thereto, and the first power voltage VDD2H and the second power voltage VDDQ may be variously set according to the standard specifications of the memory to which the embodiment is applied.

As described above, the driver 123 may operate by receiving the second power voltage VDDQ relatively lower than the first power voltage VDD2H provided to other logics of the transmitter 120 (for example, the PAM encoder 121 and the pre-driver 122), thereby reducing power consumed in the output of the DQ signal DQ, and may be previously driven by the pre-driver 122 to receive the second input signal ENCb having improved signal characteristics, thereby outputting the DQ signal DQ having good signal characteristics even at low power.

In an embodiment, the transmitter 120 may output the DQ signal DQ having different swing periods according to the type of the termination element of the memory controller 200. The transmitter 120 may receive the first setting signal from the memory controller 200, recognize the type of the termination element of the memory controller 200 based on the first setting signal, and output the DQ signal DQ having a swing period in accordance with the type of the termination element.

In an embodiment, the transmitter 120 may output not only the DQ signal DQ based on PAM-n but also the DQ signal DQ based on non-return to zero (NRZ). That is, the transmitter 120 may support a PAM-n signaling mode and an NRZ signaling mode. The transmitter 120 may receive the second setting signal from the memory controller 200 and may be set to one of the PAM-n signaling mode and the NRZ signaling mode based on the second setting signal. For example, in the PAM-n signaling mode, the driver 123 may output the DQ signal DQ based on PAM-n, and in the NRZ signaling mode, the driver 123 may output the DQ signal DQ based on NRZ.

The receiver 220 of the memory controller 200 may include an amplifier 221, a PAM decoder 222, and a deserializer 223. For example, the memory device 100 and the memory controller 200 may transmit/receive the DQ signal DQ to/from each other in a serial interfacing method, and the memory controller 200 may communicate with the host in a parallel interfacing method. However, one or more embodiments are not limited thereto, and the memory controller 200 may communicate with the host in the serial interfacing method, and, in this regard, the deserializer 223 may be omitted.

The amplifier 222 may amplify the DQ signal DQ to generate an RX signal RXS. In addition, the amplifier 221 may have an input impedance for impedance matching with the transmitter 120. In an embodiment, a termination element may be connected to the amplifier 221 of the receiver 220 for impedance matching with the transmitter 120. As described above, because the transmitter 120 outputs the DQ signal DQ that varies the swing period according to a type of the termination element of the memory controller 200 (or the receiver 220), the transmitter 120 may be connected to various memory controllers without limitation of the type of the termination element, thereby smoothly performing data transmission/reception operations.

The PAM decoder 222 may receive the RX signal RXS from the amplifier 221 and decode the RX signal RXS based on PAM-n to generate a decoding signal DES. In some embodiments, the receiver 220 may further include an equalizer to perform equalization for compensating for distortion of the DQ signal DQ. The deserializer 223 may receive the decoding signal DES and convert the decoding signal DES to RX data RXD. For example, the decoding signal DES may include a series of symbols each having a unit interval (UI) of '1/baud rate', and the deserializer 223 may output the RX data RXD of x bits (x is an integer greater than or equal to 1) at a frequency of 'baud rate/n'. The receiver 220 may provide the RX data RXD to the host In an embodiment, the transmitter 120 may be implemented to be included in a data input/output circuit of the memory device 100, and the embodiment may be also applied to a transmitter included in the memory controller 200.

Figure 2:
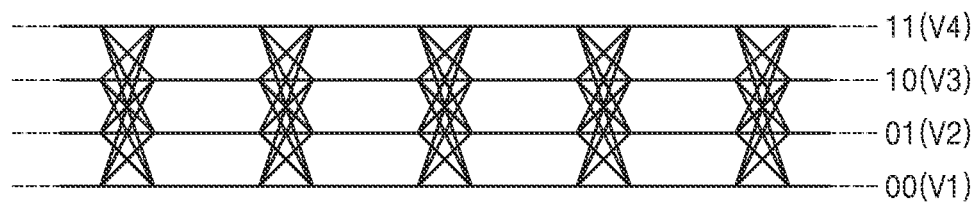
FIG. 2 is a diagram illustrating a DQ signal according to an embodiment.

FIG. 2 is a diagram illustrating the DQ signal DQ according to an embodiment. FIG. 2 illustrates the DQ signal DQ based on PAM-4 having four levels, but these are only embodiments for convenience of understanding. However, embodiments are not limited thereto, and it will be sufficiently understood that the embodiments may be also applied to a DQ signal DQ based on PAM-n having 8 or more levels.

Referring to FIG. 2, a lowest level, that is, a first level V1, of the DQ signal DQ may be mapped to 2-bit data '00', and a highest level, that is, a fourth level V4, of the DQ signal DQ may be mapped to 2-bit data '11'. Intermediate second and third levels V2 and V3 of the DQ signal DQ may be mapped to 2-bit data '01, 10'. The mapping between the voltage levels V1 to V4 and data is performed based on a gray code method, and one or more embodiments are not limited thereto, that is, the mapping method may be changed according to various purposes. For convenience of understanding, the embodiment describes the mapping relationship between the first to fourth levels V1 to V4 of the DQ signal DQ shown in FIG. 2 and 2-bit data in the description related to PAM-4 below, but it will be sufficiently understood that the embodiment is not limited thereto.

Figure 3:
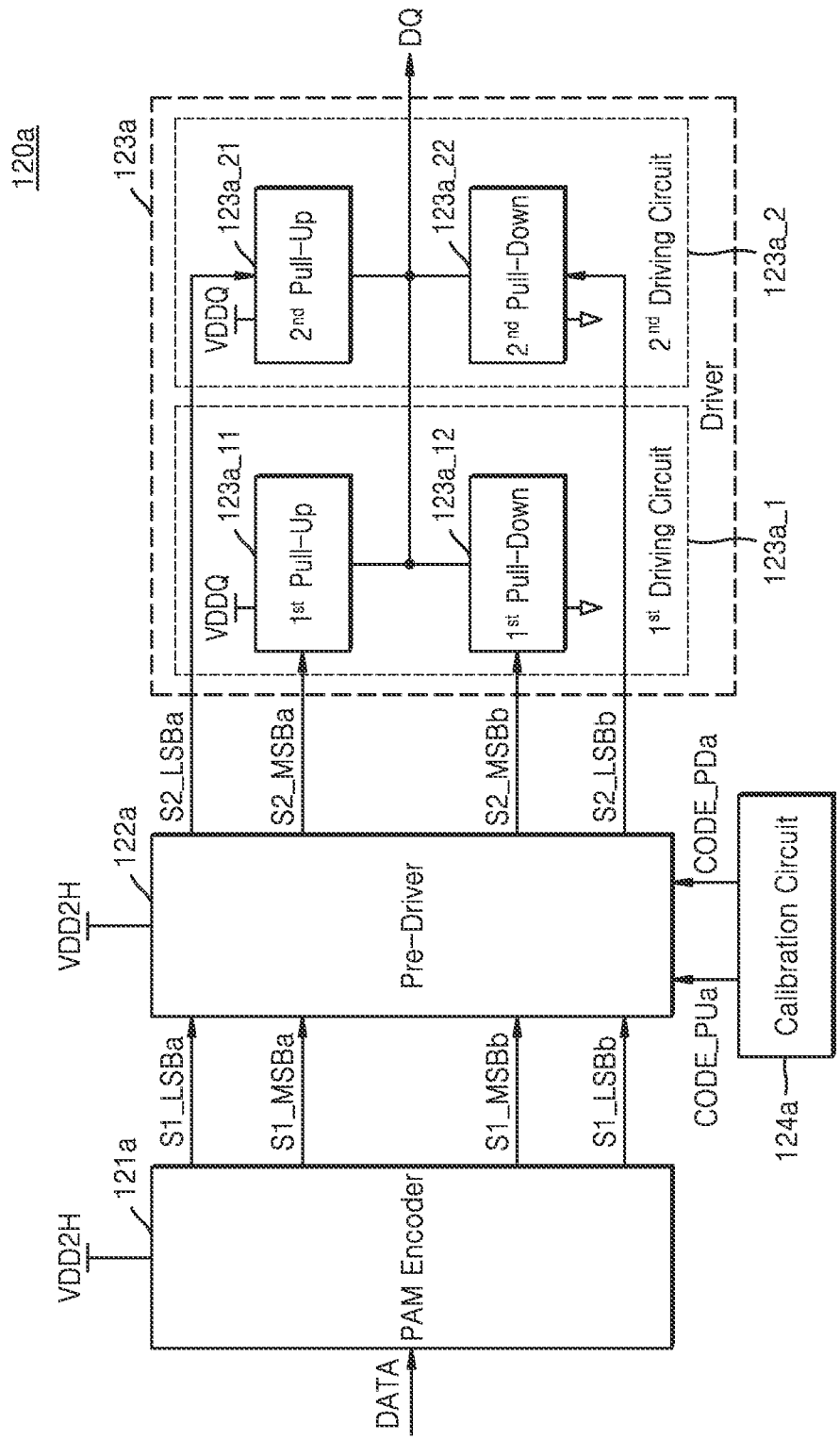
FIG. 3 is a block diagram of a transmitter according to an embodiment.

FIG. 3 is a block diagram of a transmitter 120a according to an embodiment. FIG. 3 illustrates an embodiment of the transmitter 120a that outputs the DQ signal DQ based on PAM-4, which is only an embodiment, and thus it is clear that the embodiment of the following description may also be applied to a DQ signal DQ based on higher level PAM-n. FIG. 2 may be further referred to in FIG. 3 to aid in understanding.

Referring to FIG. 3, the transmitter 120a may include a PAM encoder 121a, a pre-driver 122a, a driver 123a, and a calibration circuit 124a. The driver 123a may include first and second driving circuits 123a_1 and 123a_2. The first driving circuit 123a_1 may include a first pull-up circuit 123a_11 to which the second power voltage VDDQ is directly provided, and a first pull-down circuit 123a_12 that is grounded, and the second driving circuit 123a_2 may include a second pull-up circuit 123a_21 to which the second power voltage VDDQ is directly provided, and a second pull-down circuit 123a_22 that is grounded. In an embodiment, the PAM encoder 121a and the pre-driver 122a may be supplied with the first power voltage VDD2H, and the first and second driving circuits 123a_1 and 123a_2 may be supplied with the second power voltage VDDQ that is different from the first power voltage VDD2H. In an embodiment, the second power voltage VDDQ may be lower than the first power voltage VDD2H.

The PAM encoder 121a may receive the read data DATA from the memory cell array 140 (FIG. 1), and may generate a first input signal including first and second most significant bit (MSB) signals S1_MSBa and S1_MSBb and first and second least significant bit (LSB) signals S1_LSBa and S1_LSBb using the first power voltage VDD2H based on mapping relationships between four voltage levels of the DQ signal DQ based on PAM-4 and 2-bit data. Specifically, the first MSB signal S1_MSBa may be a signal for activating the first pull-up circuit 123a_11, the second MSB signal S1_MSBb may be a signal for activating the first pull-down circuit 123a_12, the first LSB signal S1_LSBa may be a signal for activating the second pull-up circuit 123a_21, and the second LSB signal S1_LSBb may be a signal for activating the second pull-down circuit 123a_22. Hereinafter, activation of a circuit may mean a state in which at least one of transistors included in the corresponding circuit is turned on. In addition, deactivation of the circuit may mean a state in which all transistors included in the corresponding circuit are turned off.

As an example, the PAM encoder 121a may generate the first input signals S1_MSBa, S1_MSBb, S1_LSBa, and S1_LSBb for activating the first and second pull-down circuits 123a_12 and 123a_22 to output the DQ signal DQ having the first level V1 when the read data DATA is '00' bit data, generate the first input signals S1_MSBa, S1_MSBb, S1_LSBa, and S1_LSBb for activating the first pull-up circuit 123a_12 and the second pull-down circuit 123a_21 to output the DQ signal DQ having the second level V2 when the read data DATA is '01' bit data, generate the first input signals S1_MSBa, S1_MSBb, S1_LSBa, and S1_LSBb for activating the first pull-up circuit 123a_11 and the second pull-down circuit 123a_22 to output the DQ signal DQ having the third level V3 when the data DATA is '10' bit data, and generate the first input signals S1_MSBa, S1_MSBb, S1_LSBa, and S1_LSBb for activating the first and second pull-up circuits 123a_11 and 123a_21 to output the DQ signal DQ having the fourth level V4 when the data DATA is '11' bit data.

The calibration circuit 124a may generate a calibration code signal including a pull-up code CODE_PUa and a pull-down code CODE_PDa for adjusting driving strength of each of the first and second pull-up circuits 123a_11 and 123a_21 and the first and second pull-down circuits 123a_12 and 123a_22. The calibration circuit 124a includes a replica circuit having the same configuration as the driver 123a, and may generate the calibration code signals CODE_PUa and CODE_PDa so that the DQ signal DQ has a target level separation mismatch ratio by using the replica circuit. In an embodiment, the pull-up code CODE_PUa may be a signal for determining the number of turned-on transistors among a plurality of first transistors included in each of the first and second pull-up circuits 123a_11 and 123a_21, and the pull-down code CODE_PDa may be a signal for determining the number of turned-on transistors among a plurality of second transistors included in each of the first and second pull-down circuits 123a_12 and 123a_22. That is, the driving strength of the first and second pull-up circuits 123a_11 and 123a_21 and the first and second pull-down circuits 123a_12 and 123a_22 is adjusted by the calibration code signal, and thus, the first and second pull-up circuits 123a_11 and 123a_21 and the first and second pull-down circuits 123a_12 and 123a_22 may be controlled so that the DQ signal DQ accurately reaches a target level. The calibration circuit 124a may previously determine the calibration code signals CODE_PUa and CODE_PDa by performing a certain calibration operation when a memory device is powered on or in an idle period of the memory device.

The pre-driver 122a may mutually calculate the first input signals S1_MSBa, S1_MSBb, S1_LSBa, and S1_LSBb received from the PAM encoder 121a and the calibration code signals CODE_PUa and CODE_PDa using the first power voltage VDD2H and output second input signals including third and fourth MSB signals S2_MSBa and S2_MSBb and third and fourth LSB signals S2_LSBa and S2_LSBb generated as a result of the calculation to the driver 123a. The calculation method of generating the second input signals S2_MSBa, S2_MSBb, S2_LSBa, and S2_LSBb of the pre-driver 122a may vary depending on the configuration of the driver 123a, and a specific embodiment in this regard will be described later.

The first pull-up circuit 123a_11 may receive the third MSB signal S2_MSBa, may be activated in response to the third MSB signal S2_MSBa, and simultaneously the driving strength thereof may be determined. The second pull-up circuit 123a_21 may receive the third LSB signal S2_LSBa, may be activated in response to the third LSB signal S2_LSBa, and simultaneously the driving strength thereof may be determined. The first pull-down circuit 123a_12 may receive the fourth MSB signal S2_MSBb, may be activated in response to the fourth MSB signal S2_MSBb, and simultaneously the driving strength thereof may be determined. The second pull-down circuit 123a_22 may receive the fourth LSB signal S2_LSBb, may be activated in response to the fourth LSB signal S2_LSBb, and simultaneously the driving strength thereof may be determined.

The driver 123a may generate a DQ signal DQ using the second power voltage VDDQ through the configuration of the first and second pull-up circuits 123a_11 and 123a_21 and the first and second pull-down circuits 123a_12 and 123a_22.

Figure 4A:
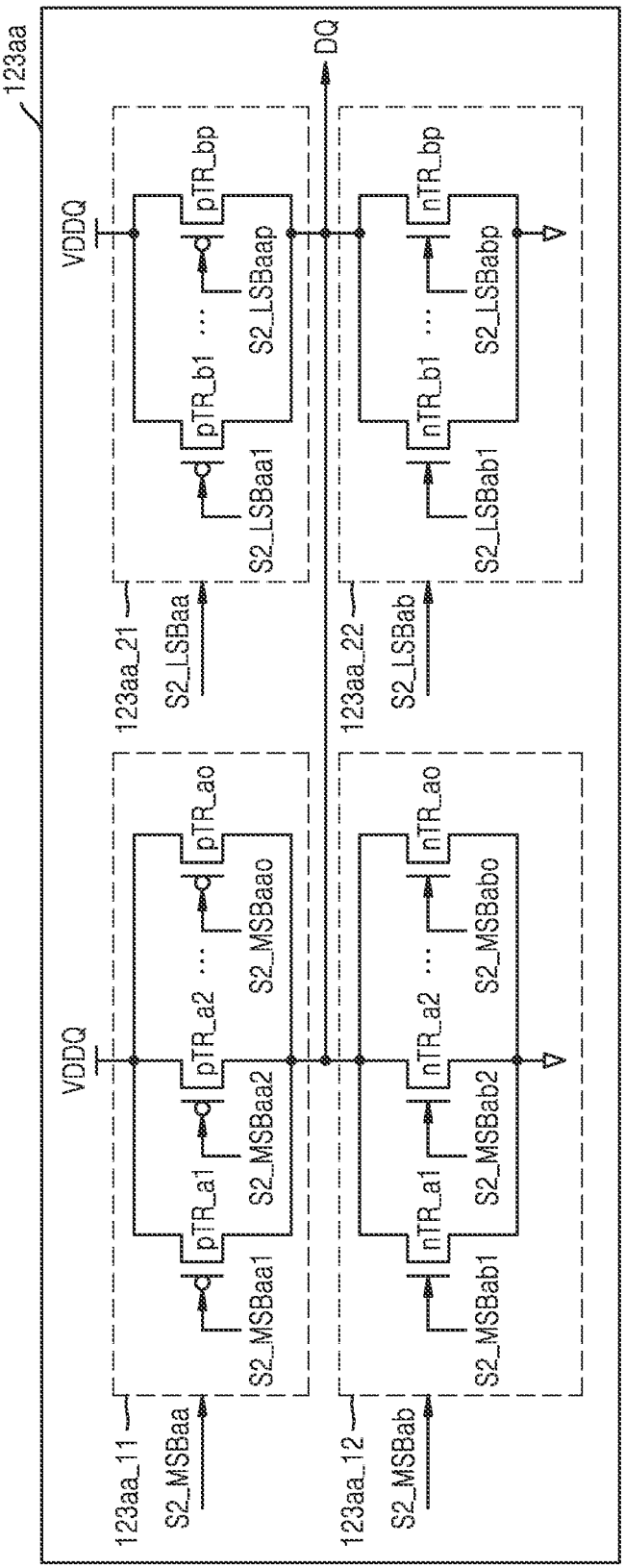
FIGS. 4A and 4B are circuit diagrams of examples of a driver of FIG. 3.
Figure 4B:
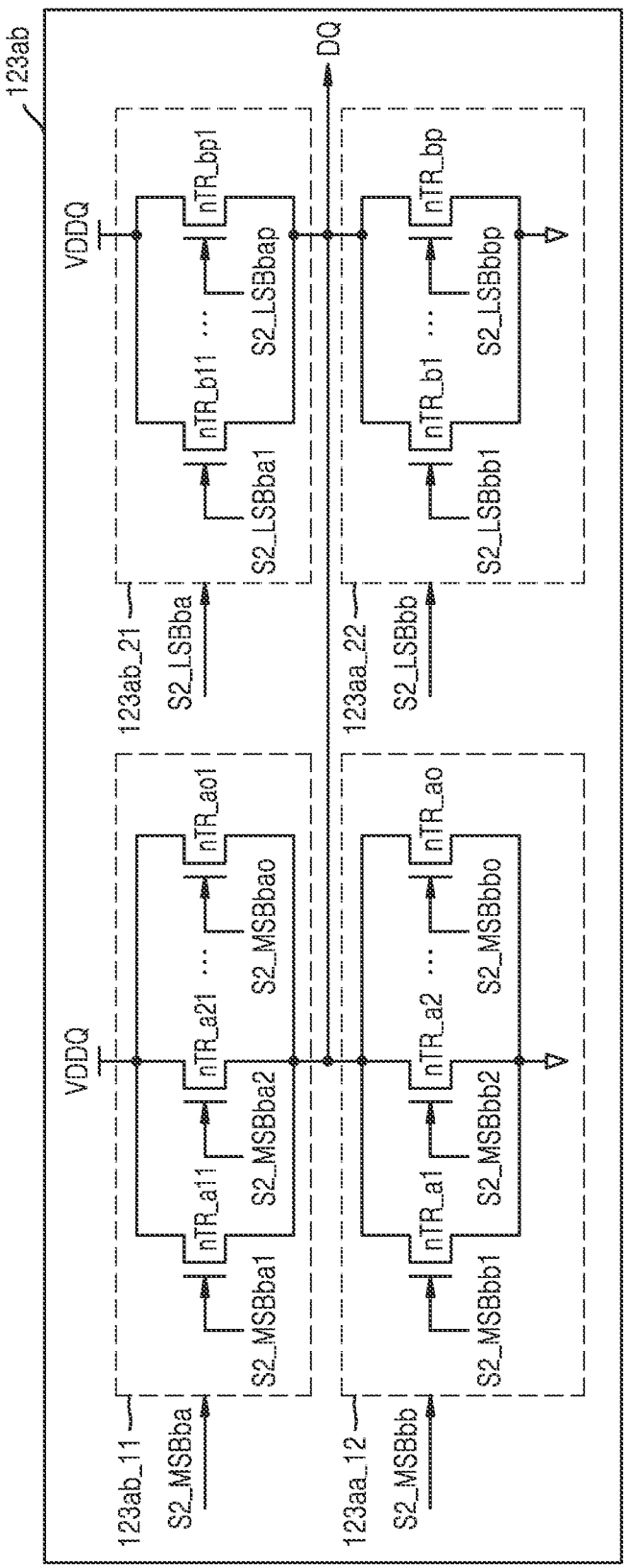

FIGS. 4A and 4B are circuit diagrams of examples of the driver 123a of FIG. 3.

Referring to FIG. 4A, a driver 123aa may include first and second pull-up circuits 123aa_11 and 123aa_21 and first and second pull-down circuits 123aa_12 and 123aa_22. The first pull-up circuit 123aa_11 may include 'o' (where o is an integer greater than or equal to 2)' pMOS transistors pTR_a1 to pTR_ao, and the first pull-down circuit 123aa_12 may include 'o' nMOS transistors nTR_a1 to nTR_ao. The second pull-up circuit 123aa_21 may include 'p' (where p is an integer greater than or equal to 2)' pMOS transistors pTR_b1 to pTR_bp, and the second pull-down circuit 123aa_22 may include 'p' nMOS transistors nTR_b1 to nTR_bp.

In an embodiment, the pMOS transistors pTR_a1 to pTR_ao of the first pull-up circuit 123aa_11 may receive a third MSB signal S2_MSBaa through a gate terminal thereof. The third MSB signal S2_MSBaa may include 'o' signals S2_MSBaa1 to S2_MSBaao respectively input to the pMOS transistors pTR_a1 to pTR_ao.

In an embodiment, the nMOS transistors nTR_a1 to nTR_ao of the first pull-down circuit 123aa_12 may receive a fourth MSB signal S2_MSBab through the gate terminal thereof. The fourth MSB signal S2_MSBab may include 'o' signals S2_MSBab1 to S2_MSBabo respectively input to the nMOS transistors nTR_a1 to nTR_ao.

In an embodiment, the pMOS transistors pTR_b1 to pTR_bp of the second pull-up circuit 123aa_21 may receive a third LSB signal S2_LSBaa through the gate terminal thereof. The third LSB signal S2_LSBaa may include 'p' signals S2_LSBaa1 to S2_LSBaap respectively input to the pMOS transistors pTR_b1 to pTR_bp.

In an embodiment, the nMOS transistors nTR_b1 to nTR_bp of the second pull-down circuit 123aa_22 may receive a fourth LSB signal S2_LSBab through the gate terminal thereof. The fourth LSB signal S2_LSBab may include 'p' signals S2_LSBab1 to S2_LSBabp respectively input to the nMOS transistors nTR_b1 to nTR_bp.

Meanwhile, the first pull-up circuit 123aa_11 and the first pull-down circuit 123aa_12 may be implemented to respectively have greater driving strength than that of the second pull-up circuit 123aa_21 and the second pull-down circuit 123aa_22. For example, the number of transistors included in the first pull-up circuit 123aa_11 and the first pull-down circuit 123aa_12 may be more than the number of transistors included in the second pull-up circuit 123aa_21 and the second pull-down circuit 123aa_22. In some embodiments, the number of transistors included in the first pull-up circuit 123aa_11 and the first pull-down circuit 123aa_12 may be the same as the number of transistors included in the second pull-up circuit 123aa_21 and the second pull-down circuit 123aa_22, but the transistors included in the first pull-up circuit 123aa_11 and the first pull-down circuit 123aa_12 may be implemented to have a characteristic that more current may flow through them than through the transistors included in the second pull-up circuit 123aa_21 and the second pull-down circuit 123aa_22 under the same condition.

Some of the first and second pull-up circuits 123aa_11 and 123aa_21 and the first and second pull-down circuits 123aa_12 and 123aa_22 of the driver 123aa may be activated in response to the second input signals S2_MSBaa, S2_MSBab, S2_LSBaa, and S2_LSBab, and the number of turned-on transistors with respect to each of the activated circuits may be determined, and thus, the DQ signal DQ based on PAM-4 may be output.

Referring further to FIG. 4B, the driver 123ab may be different from the driver 123aa of FIG. 4A in the configuration of the first and second pull-up circuits 123ab_11 and 123ab_21. In an embodiment, the first pull-up circuit 123ab_11 may include 'o' nMOS transistors nTR_a11 to nTR_ao1, and the second pull-up circuit 123ab_21 may include 'p' nMOS transistors nTR_b11 to nTR_bp1. The nMOS transistors nTR_a11 to nTR_ao1 of the first pull-up circuit 123ab_11 may receive the third MSB signal S2_MSBba through the gate terminal thereof, and the nMOS transistors nTR_b11 to nTR_bp1 of the second pull-up circuit 123ab_21 may receive the third LSB signal S2_LSBba through the gate terminal thereof. The third MSB signal S2_MSBba may include 'o' signals S2_MSBba1 to S2_MSBbao respectively input to the nMOS transistors nTR_a11 to nTR_ao1 of the first pull-up circuit 123ab_11, and the third LSB signal S1_LSBbb may include 'p' signals S2_LSBba1 to S2_LSBbap respectively input to the nMOS transistors nTR_b11 to nTR_bp1 of the second pull-up circuit 123ab_21.

In the embodiment, because the driver 123ab outputs the DQ signal DQ based on the second input signals S2_MSBbb, S2_MSBba, S2_LSBbb, and S2_LSBba having good signal characteristics driven through a pre-driver, the first and second pull-up circuits 123ab_11 and 123ab_21 may be configured as an nMOS transistor (or an n-channel metal-oxide semiconductor field effect transistor (MOSFET)). The size of the driver 123ab may be reduced through the configuration shown in FIG. 4B, which may be advantageous in terms of designing a memory device.

Figure 5A:
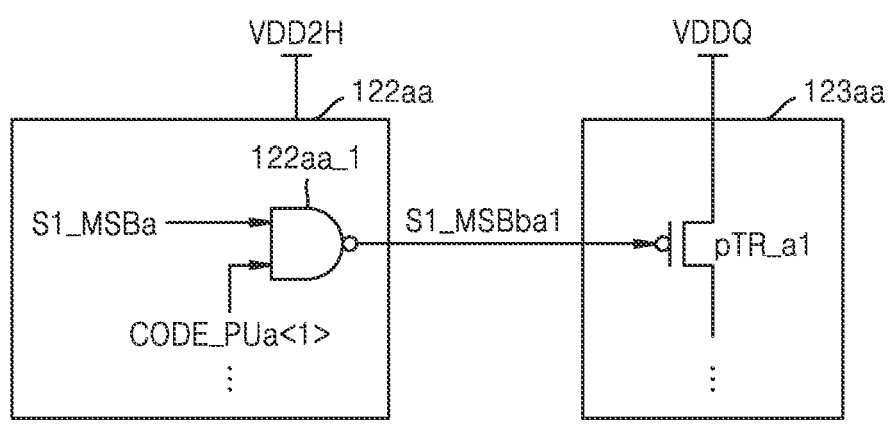
FIGS. 5A and 5B are circuit diagrams of examples of a pre-driver of FIG. 3.
Figure 5B:
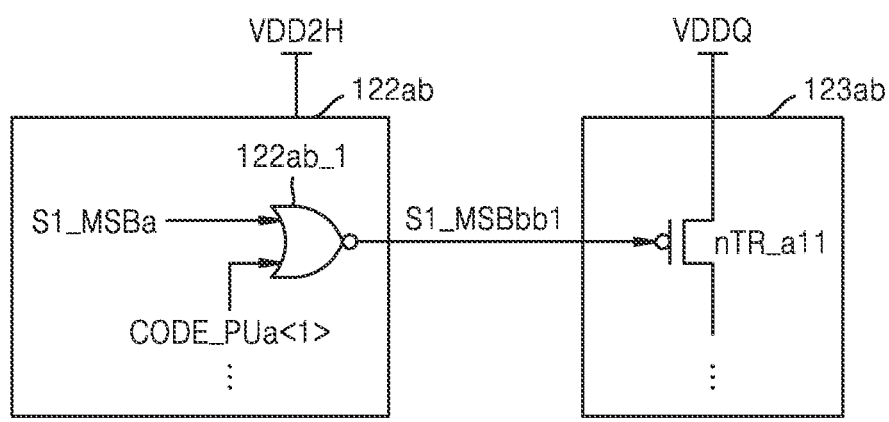

FIGS. 5A and 5B are circuit diagrams of examples of the pre-driver 122a of FIG. 3. FIG. 5A shows an example of a pre-driver 122aa connected to the driver 123aa shown in FIG. 4A, and FIG. 5B shows an example of a pre-driver 122ab connected to the driver 123ab shown in FIG. 4B.

Referring to FIG. 5A, the pre-driver 122aa may include a plurality of NAND circuits. In an embodiment, the plurality of NAND circuits may respectively correspond to a plurality of transistors included in the driver 123aa (for example, the plurality of transistors pTR_a1 to pTR_ao, pTR_b1 to pTR_bp, nTR_a1 to nTR_ao, and nTR_b1 to nTR_bp of FIG. 4A), and an output terminal of a NAND circuit may be connected to a gate terminal of the corresponding transistor. For example, the plurality of NAND circuits may include a first NAND circuit 122aa_1. Specifically, the first NAND circuit 122aa_1 may correspond to the first pMOS transistor pTR_a1 included in the first pull-up circuit 123aa_11 (FIG. 4A) of the driver 122aa. The first NAND circuit 122aa_1 may receive the first MSB signal S1_MSBa and the pull-up code CODE_PUa<1>, and perform a NAND operation to output the first signal S1_MSBba1 included in the third MSB signal to a gate terminal of the first pMOS transistor pTR_a1. In an embodiment, when the first pMOS transistor pTR_a1 is turned on by the first signal S1_MSBab1, a gate-source voltage of the first pMOS transistor pTR_a1 may be greater than a drain-source voltage. Accordingly, the linearity of the first pMOS transistor pTR_a1 may be improved so that the driver 123aa may output a DQ signal having good characteristics.

Referring to FIG. 5B, the pre-driver 122ab may include a plurality of NOR circuits. In an embodiment, the plurality of NOR circuits may respectively correspond to a plurality of transistors included in the driver 123ab (for example, the plurality of transistors nTR_a11 to nTR_ao1, nTR_b11 to nTR_bp1, nTR_a1 to nTR_ao, nTR_b1 to nTR_bp of FIG. 4B), and an output terminal of an NOR circuit may be connected to the gate terminal of the corresponding transistor. For example, the plurality of NOR circuits may include a first NOR circuit 122ab_1. Specifically, the first NOR circuit 122ab_1 may correspond to the first nMOS transistor nTR_a11 included in the first pull-up circuit 123ab_11 (FIG. 4B) of the driver 122ab. The first NOR circuit 122ab_1 may receive the first MSB signal S1_MSBa and the pull-up code CODE_PUa<1>, and perform a NOR operation to output the first signal S1_MSBba1 included in the third MSB signal to a gate terminal of the first nMOS transistor nTR_a11. In an embodiment, when the first pMOS transistor pTR_a1 is turned on by the first signal S1_MSBba1, a gate-source voltage of the first nMOS transistor nTR_a11 may be greater than a drain-source voltage. Accordingly, the linearity of the first nMOS transistor nTR_a11 may be improved so that the driver 123ab may output a DQ signal having good characteristics.

Figure 6A:
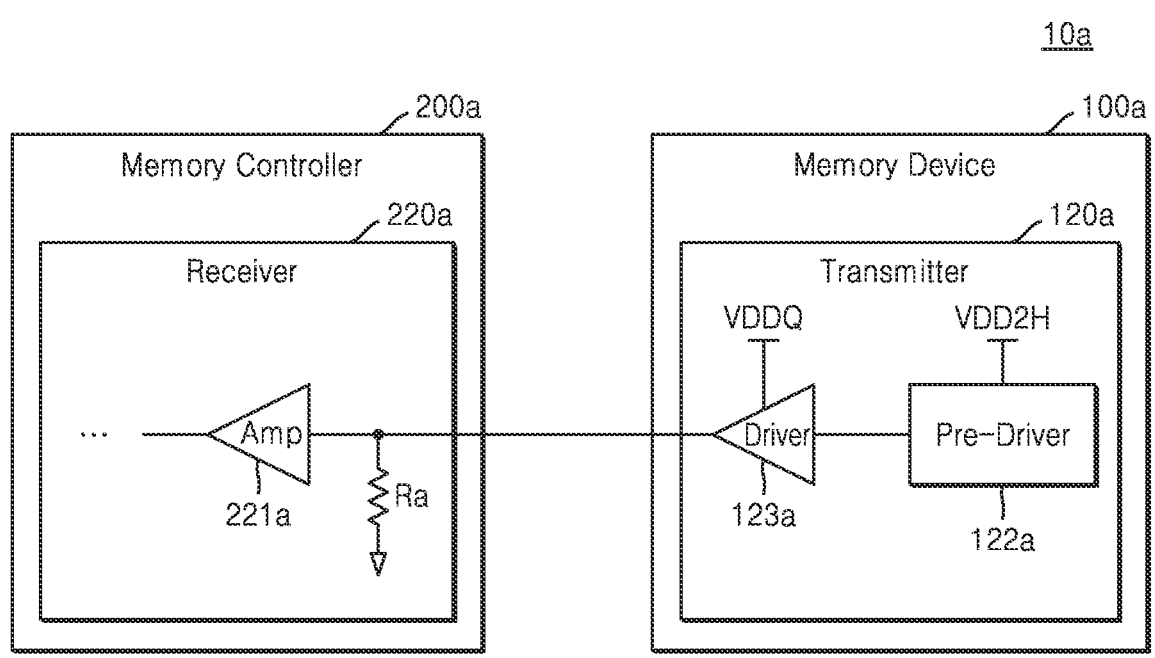
FIGS. 6A to 6C are block diagrams illustrating memory systems for describing memory devices according to embodiments connected to memory controllers having various types of termination elements.
Figure 6B:
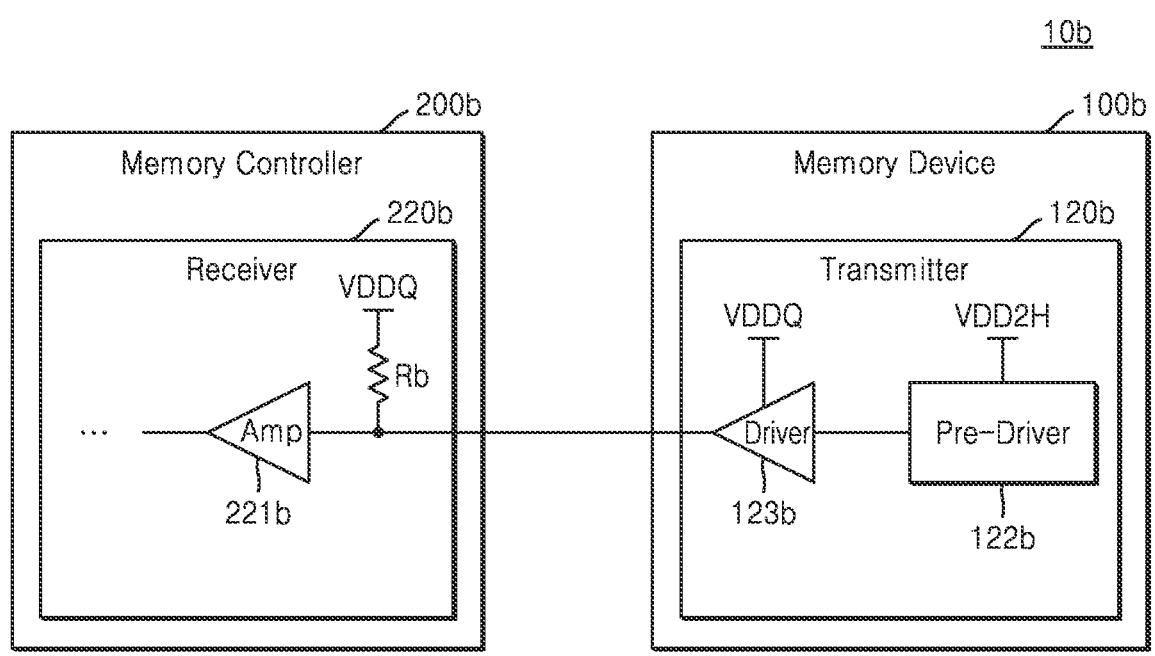
Figure 6C:
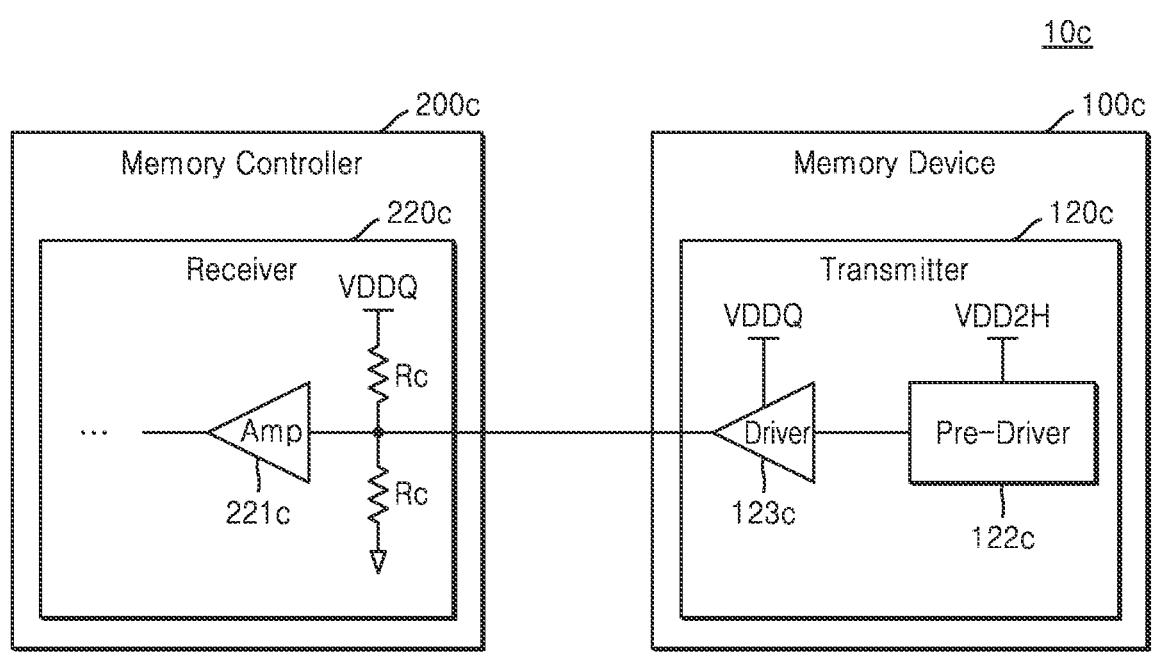

FIGS. 6A to 6C are block diagrams illustrating memory systems 10a to 10c for describing memory devices 100a to 100c according to embodiments connected to memory controllers 200a to 200c having various types of the termination element.

Referring to FIG. 6A, the memory system 10a may include the memory device 100a and the memory controller 200a. A receiver 220a may include an amplifier 221a and a first type of termination element Ra connected to an input terminal of the amplifier 221a. The first type may be referred to as a ground type because one end of the termination element Ra is grounded. The memory device 100a includes the transmitter 120a according to an embodiment, the pre-driver 122a may operate using the first power voltage VDD2H, and the driver 123a may operate using the second power voltage VDDQ, and thus, a DQ signal having a first swing period may be output to the memory controller 200a.

Referring to FIG. 6B, the memory system 10b may include the memory device 100b and the memory controller 200b. The receiver 220b may include an amplifier 221b and a second type of termination element Rb connected to an input terminal of the amplifier 221b. The second type may be referred to as a pseudo open drain type because one end of the termination element Rb is connected to the second power voltage VDDQ. The memory device 100b includes the transmitter 120b according to an embodiment, the pre-driver 122b may operate using the first power voltage VDD2H, and the driver 123b may operate using the second power voltage VDDQ, and thus, a DQ signal having a second swing period may be output to the memory controller 200b.

Referring to FIG. 6C, the memory system 10c may include the memory device 100c and the memory controller 200c. The receiver 220c may include an amplifier 221c and a third type of termination elements Rc connected to an input terminal of the amplifier 221c. The third type may be referred to as a center tap termination type because one end of one of the termination elements Rc is connected to the second power voltage VDDQ and one end of the other one of the termination elements Rc is grounded. The memory device 100c includes the transmitter 120c according to an embodiment, the pre-driver 122c may operate using the first power voltage VDD2H, and the driver 123c may operate using the second power voltage VDDQ, and thus a DQ signal having a third swing period may be output to the memory controller 200c.

Figure 7A:
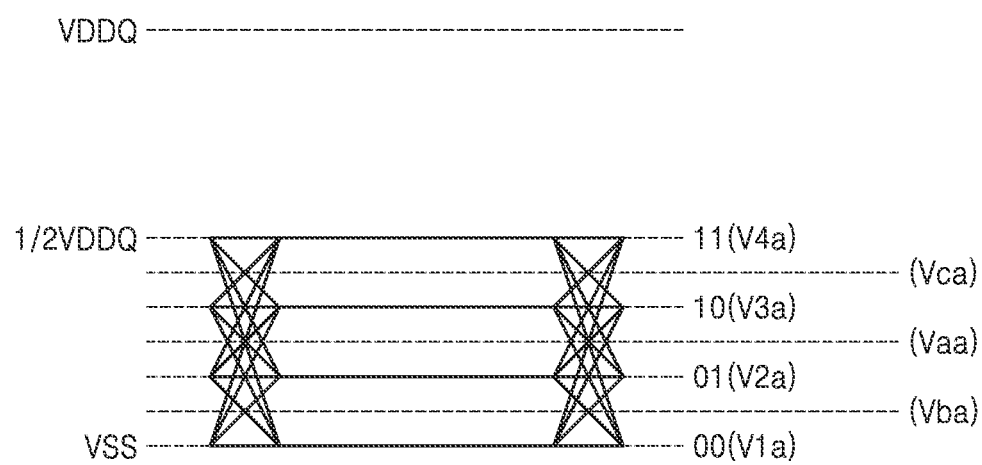
FIGS. 7A to 7C are diagrams illustrating first to third swing periods of DQ signals in FIGS. 6A to 6C.
Figure 7B:
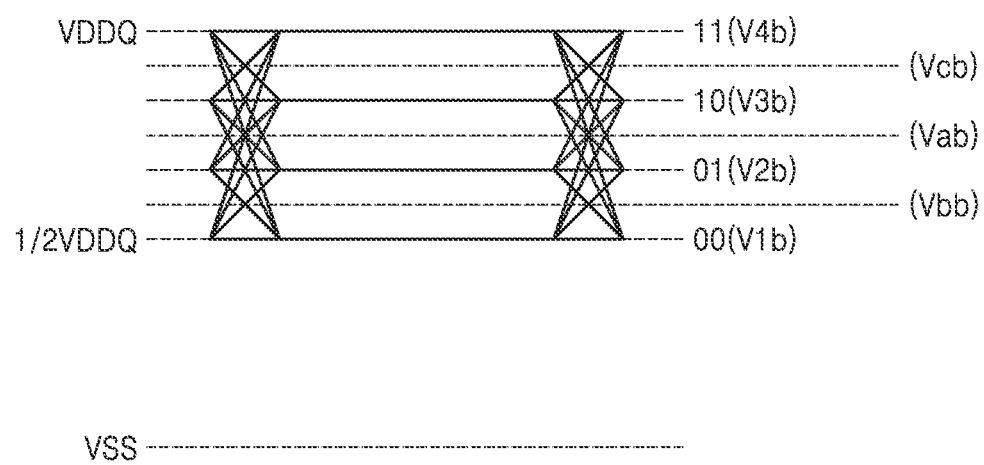
Figure 7C:
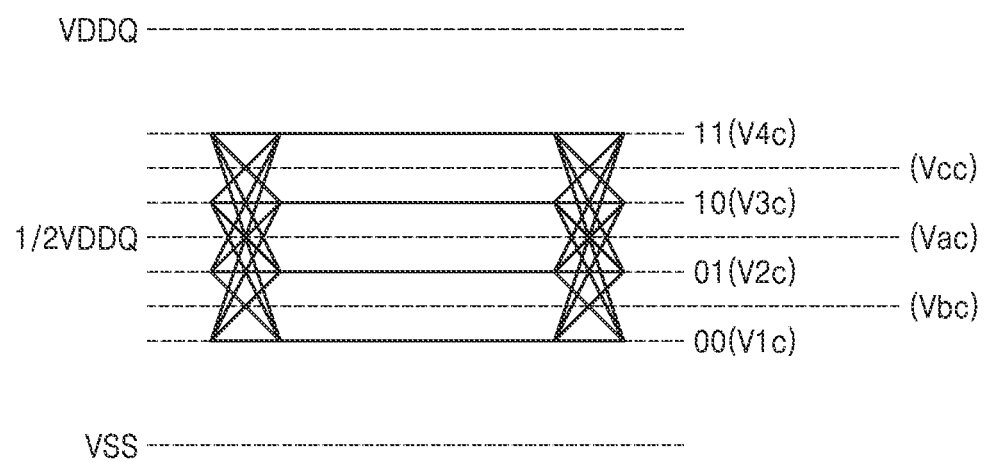

FIGS. 7A to 7C are diagrams illustrating first to third swing periods of DQ signals in FIGS. 6A to 6C.

FIG. 7A shows the DQ signal output from the transmitter 120a of FIG. 6A, a lowest first level V1a of the DQ signal may match a ground voltage VSS, and a highest fourth level V4a of the DQ signal may match '½' of the second power voltage VDDQ. The second and third intermediate levels V2a and V3a of the DQ signal may match '⅙' and '⅓' of the second power voltage VDDQ, respectively. That is, the DQ signal may swing to any one of the first to fourth levels V1a to V4a in a first swing period between the ground voltage VSS and '½' of the second power voltage VDDQ. Meanwhile, descriptions of levels Vaa to Vca used in the calibration circuit 124a (FIG. 3) to distinguish the first to fourth levels V1a to V4a will be described later.

FIG. 7B shows the DQ signal output from the transmitter 120b of FIG. 6B, and a lowest first level V1b of the DQ signal may match '½' of the second power voltage VDDQ, and a highest fourth level V4b of the DQ signal may match the second power voltage VDDQ. The second and third intermediate levels V2b and V3b of the DQ signal may match '⅔' and '⅚' of the second power voltage VDDQ, respectively. That is, the DQ signal may swing to any one of the first to fourth levels V1b to V4b in a second swing period between '½' of the second power voltage VDDQ and the second power voltage VDDQ. Meanwhile, descriptions of levels Vab to Vcb used in the calibration circuit 124b (FIG. 3) to distinguish the first to fourth levels V1b to V4b will be described later.

FIG. 7C shows the DQ signal output from the transmitter 120c of FIG. 6C, and a lowest first level V1c of the DQ signal may match '¼' of the second power voltage VDDQ, and a highest fourth level V4c of the DQ signal may match '¾' of the second power voltage VDDQ. The second and third intermediate levels V2c and V3c of the DQ signal may match '5/12' and '7/12' of the second power voltage VDDQ, respectively. That is, the DQ signal may swing to any one of the first to fourth levels V1c to V4c in a third swing period between '¼' of the second power voltage VDDQ and '¾' of the second power voltage VDDQ. Meanwhile, descriptions of levels Vac to Vcc used in the calibration circuit 124b (FIG. 3) to distinguish the first to fourth levels V1c to V4c will be described later.

Figure 8:
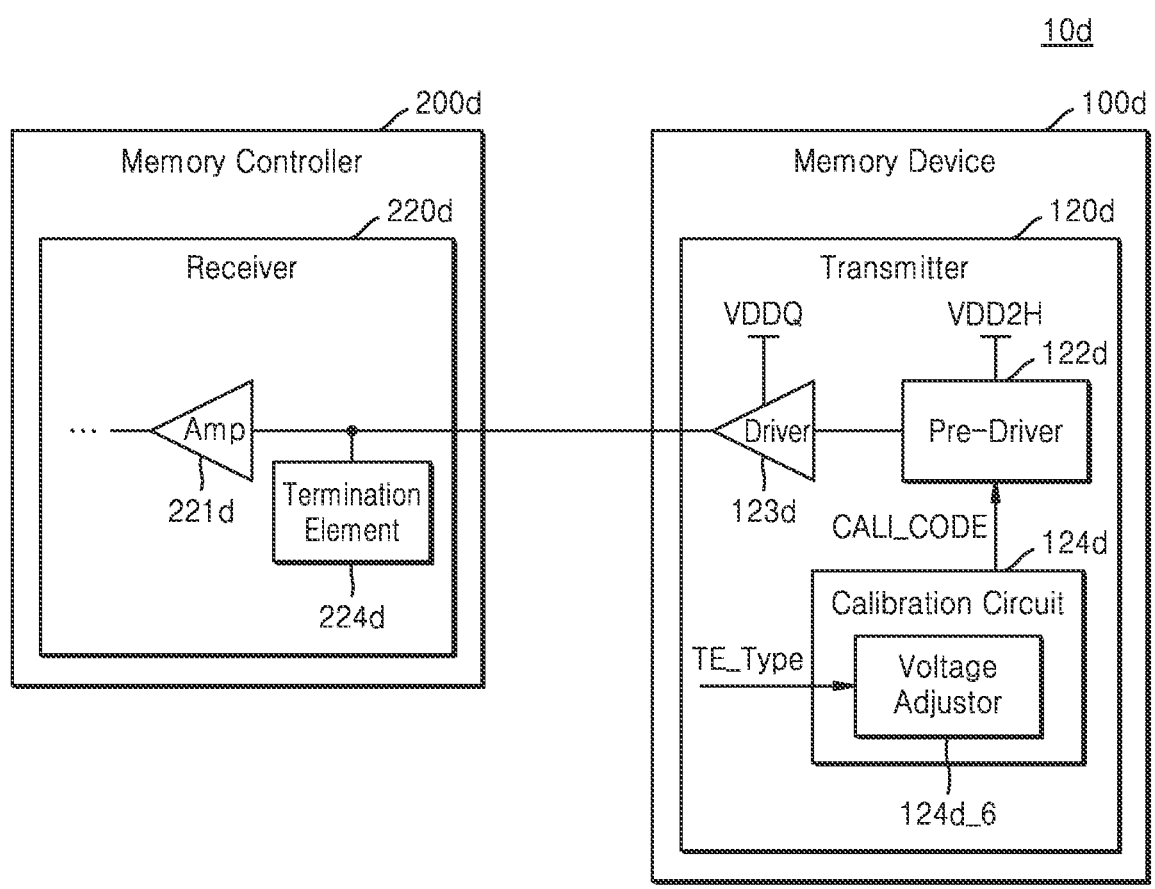
FIG. 8 is a block diagram of a memory system illustrating a transmitter of a memory device that outputs a DQ signal having a swing period according to a type of a termination element of a memory controller according to an embodiment.

FIG. 8 is a block diagram of a memory system 10d illustrating a transmitter 120d of a memory device 100d that outputs a DQ signal having a swing period according to a type of a termination element 224d of a memory controller 200d according to an embodiment.

Referring to FIG. 8, the memory system 10d may include the memory device 100d and the memory controller 200d. The memory device 100d may include the transmitter 120d, and the transmitter 120d may include a pre-driver 122d, a driver 123d, and a calibration circuit 124d. The memory controller 200d may include a receiver 220d, and the receiver 220d may include an amplifier 221d and the termination element 224d. The memory controller 200d may provide a first setting signal TE_Type indicating the type of the termination element 224d to the memory device 100d in various ways. For example, the memory controller 200d may provide the first setting signal TE_Type to the memory device 100d through a pin for transmitting a command, a pin for transmitting an address, or a separate pin.

The calibration circuit 124d according to an embodiment may receive the first setting signal TE_Type and perform an operation for generating a calibration code signal CALI_CODE based on the first setting signal TE_Type. That is, the calibration circuit 124d may generate the calibration code signal CALI_CODE to generate the DQ signal in accordance with the type of the termination element 224d of the memory controller 200d to which the memory device 100d is connected. As shown in FIGS. 7A to 7C, the DQ signal may have different swing periods depending on the type of the termination element 224d of the memory controller 200d, and thus, the levels Vaa to Vca, Vab to Vcb, and Vac to Vcc (FIGS. 7A to 7C) used according to the type of the termination element 224d may vary when the calibration circuit 124d generates the calibration code signal CALI_

CODE. The calibration circuit 124d may include a voltage adjustor 124d_6, and the voltage adjustor 124d_6 may adjust levels based on the first setting signal TE_Type, and generate the calibration code signal CALI_CODE using the adjusted levels. The pre-driver 122d and the driver 123d may receive the first and second power voltages VDD2H and VDDQ, respectively, and generate and output the DQ signal based on the calibration code signal CALI_CODE.

Figure 9:
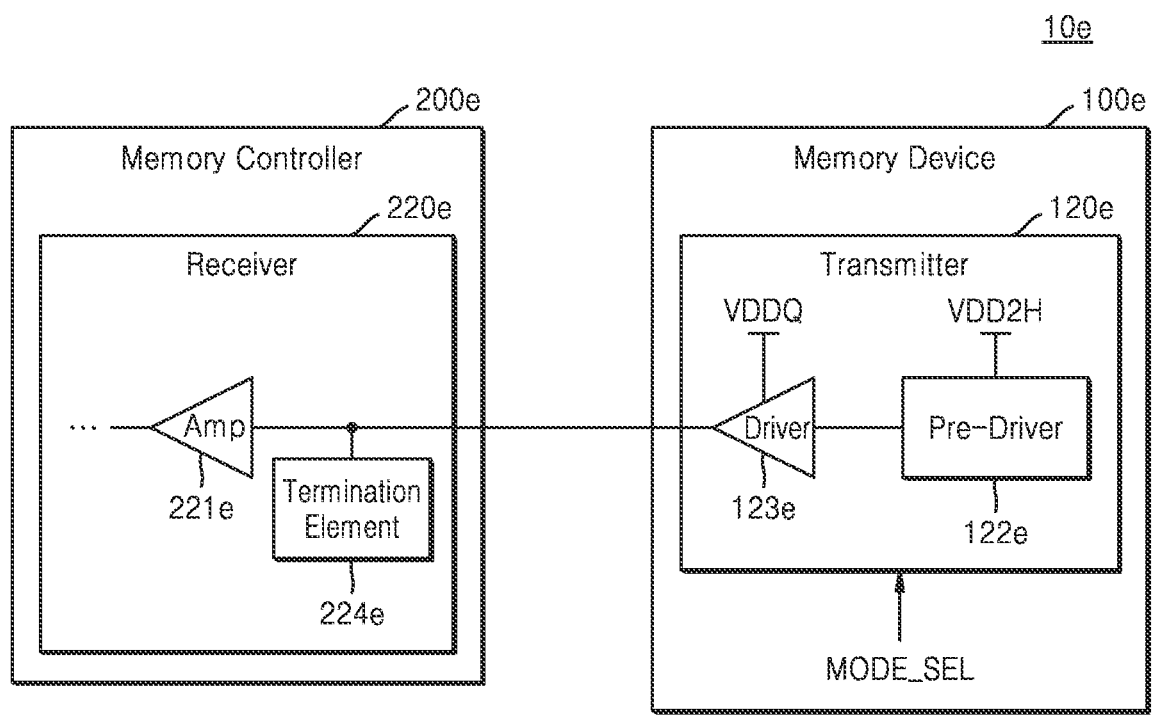
FIG. 9 is a block diagram of a memory system illustrating a transmitter of a memory device supporting a PAM-n signaling mode and a non-return to zero (NRZ) signaling mode according to an embodiment.
Figure 10A:
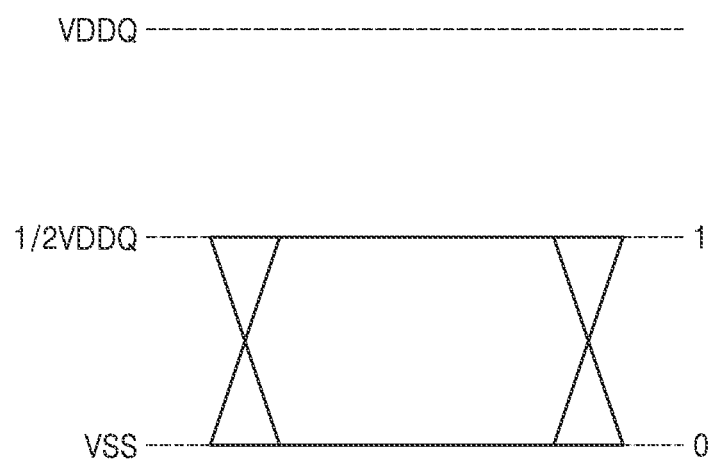
FIGS. 10A to 10C are diagrams illustrating first to third swing periods of a DQ signal in the NRZ signaling mode.
Figure 10B:
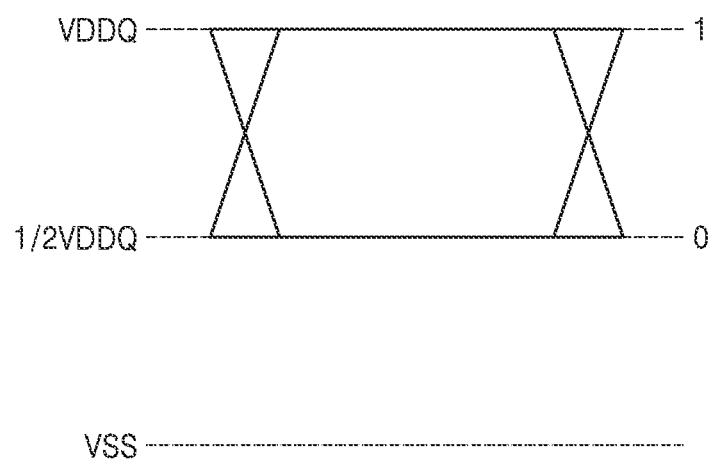
Figure 10C:
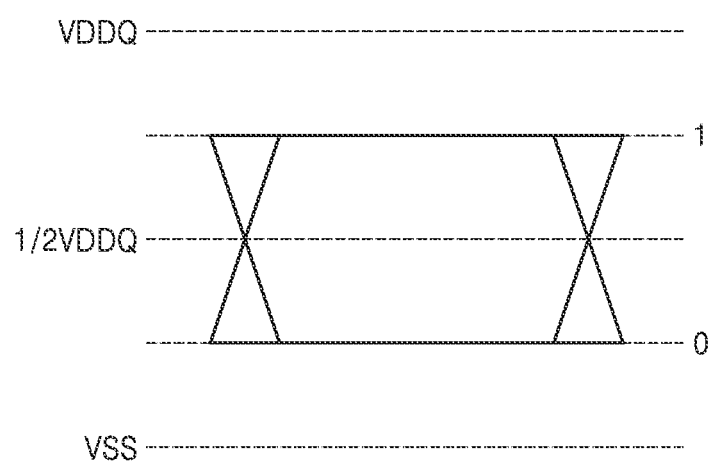

FIG. 9 is a block diagram of a memory system 10e illustrating a transmitter 120e of a memory device 100e supporting a PAM-n signaling mode and an NRZ signaling mode according to an embodiment. FIGS. 10A to 10C are diagrams illustrating first to third swing periods of a DQ signal in the NRZ signaling mode.

Referring to FIG. 9, the memory system 10e may include the memory device 100e and a memory controller 200e. The memory device 100e may include a transmitter 120e, and the transmitter 120e may include a pre-driver 122e and a driver 123e. The memory controller 200e may include a receiver 220e, and the receiver 220e may include an amplifier 221e and a termination element 224e. The transmitter 120e may support the PAM-n signaling mode and the NRZ signaling mode, and the memory controller 200e may provide a second setting signal MODE_SEL for setting a signaling mode of the transmitter 120e to the transmitter 120e. The transmitter 120e may operate by being set to one of the PAM-n signaling mode and the NRZ signaling mode in response to the second setting signal MODE_SEL. The transmitter 120e illustrated in FIG. 9 is an embodiment, and is not limited thereto. The transmitter 120e may further include a calibration circuit that may generate a calibration code signal for generating a DQ signal based on NRZ.

In addition, in an embodiment, the transmitter 120e may output the DQ signal based on NRZ that varies a swing period according to a type of the termination element 224e of the memory controller 200e.

Referring further to FIG. 10A, when the type of the termination element 224e of the memory controller 200e is a ground type described with reference to FIG. 6A, the DQ signal output from the transmitter 120e may swing in a first swing period between the ground voltage VSS and '½' of the second power voltage VDDQ.

Referring further to FIG. 10B, when the type of the termination element 224e of the memory controller 200e is a pseudo open drain type described with reference to FIG. 6B, the DQ signal output from the transmitter 120e may swing in a second swing period between '½' of the second power voltage VDDQ and the second power voltage VDDQ.

Referring further to FIG. 10C, when the type of the termination element 224e of the memory controller 200e is a center tap termination element described with reference to FIG. 6C, the DQ signal output from the transmitter 120e may swing in a third swing period between '¼' of the second power voltage VDDQ and '¾' of the second power voltage VDDQ.

Returning to FIG. 9 again, the transmitter 120e may additionally receive a first setting signal indicating the type of the termination element 224e from the memory controller 200e for operations of FIGS. 10A to 10C.

Figure 11:
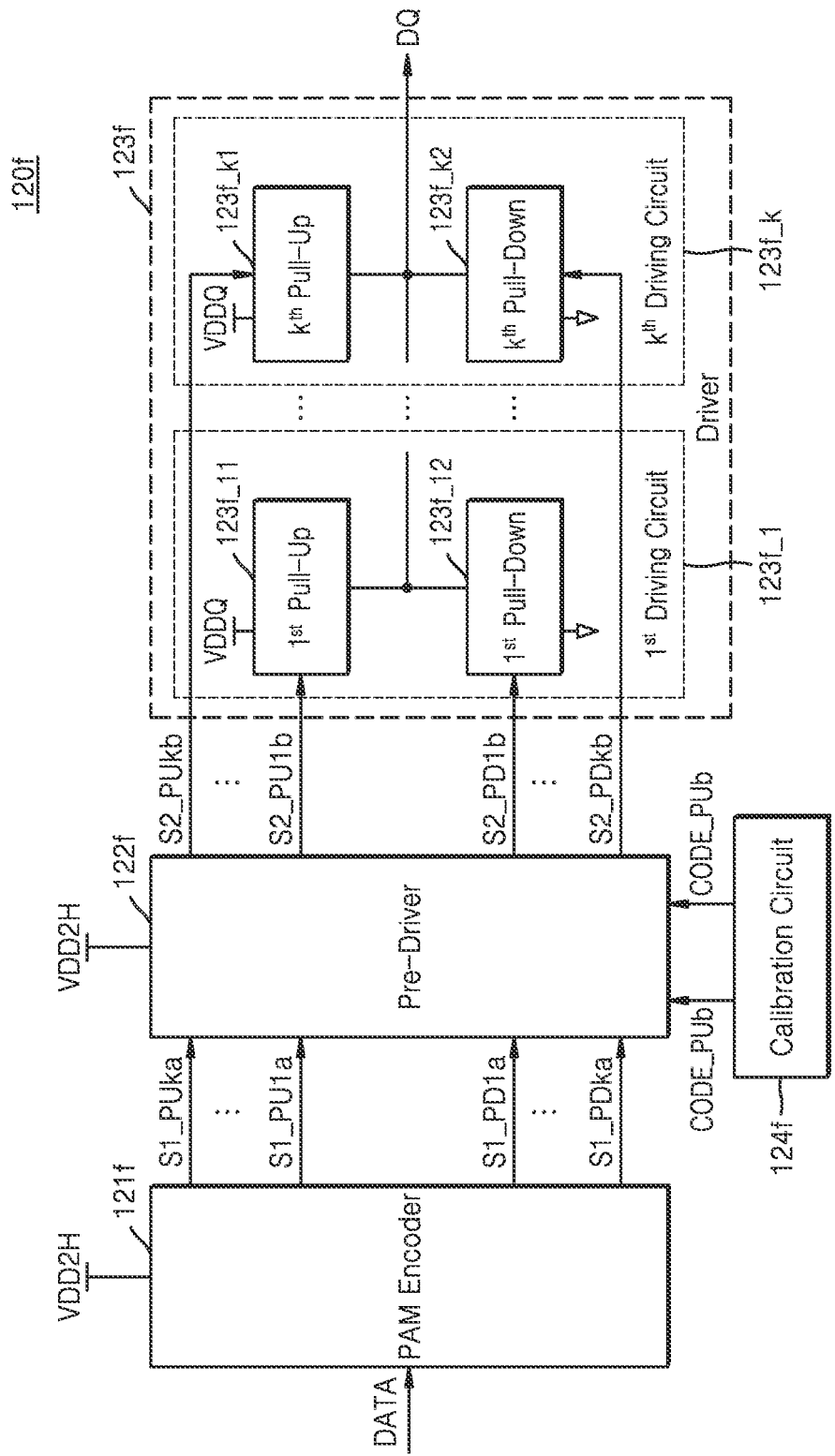
FIG. 11 is a block diagram illustrating a transmitter that outputs a DQ signal based on PAM-n according to an embodiment.

FIG. 11 is a block diagram illustrating a transmitter 120f that outputs a DQ signal based on PAM-n according to an embodiment.

Referring to FIG. 11, the transmitter 120f may include a PAM encoder 121f, a pre-driver 122f, a driver 123f, and a calibration circuit 124f. The driver 123f may include first to k-th (k is an integer greater than or equal to 2) driving circuits 123f_1 to 123f_k. In some embodiments, the number of driving circuits of the driver 123f varies according to a PAM order 'n' or the driver 123f has a fixed number of driving circuits such that the number of driving circuits activated according to the PAM order 'n' varies.

The first driving circuit 123f_1 may include a first pull-up circuit 123f_11 to which the second power voltage VDDQ is directly provided and a grounded first pull-down circuit 123f_12, and the k-th driving circuit 123f_k may include a k-th pull-up circuit 123f_k1 to which the second power voltage VDDQ is directly provided and a grounded k-th pull-down circuit 123f_k2. The second to k-1th driving circuits 123f_2 to 123f_k−1 may be implemented in the same configuration as the first and k-th driving circuits 123f_1 and 123f_k.

The PAM encoder 121f may encode the read data DATA using the first power voltage VDD2H to generate first input signals S1_PU1a to S1_PUka and S1_PD1a to S1_PDka, and provide the first input signals S1_PU1a to S1_PUka and S1_PD1a to S1_PDka to the pre-driver 122f. The calibration circuit 124f may previously perform a calibration operation such that the DQ signal DQ has a level separation mismatch ratio in accordance with the PAM order 'n' to provide determined calibration code signals CODE_PUb and CODE_PDb to the pre-driver 122f. The pre-driver 122f may generate second input signals S2_PU1b to S2_PUkb and S2_PD1b to S2_PDkb based on the first input signals S1_PU1a to S1_PUka and S1_PD1a to S1_PDka and the calibration code signals CODE_Pub and CODE_PDb and provide the second input signals S2_PU1b to S2_PUkb and S2_PD1b to S2_PDkb to the driver 123f using the first power voltage VDD2H. The driver 123f may output the DQ signal DQ based on PAM-n using the second power voltage VDDQ in response to the second input signals S2_PU1b to S2_PUkb and S2_PD1b to S2_PDkb.

Figure 12A:
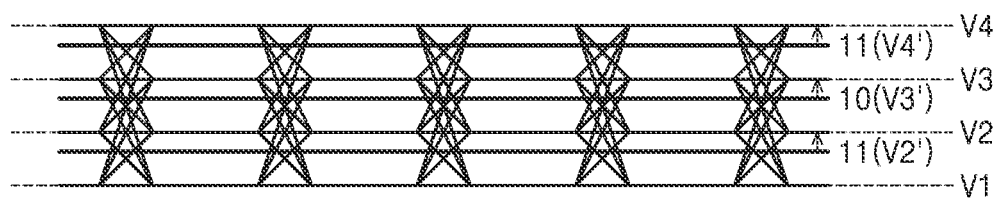
FIGS. 12A and 12B are diagrams illustrating a characteristic change of a DQ signal according to an operating environment of a memory device.
Figure 12B:
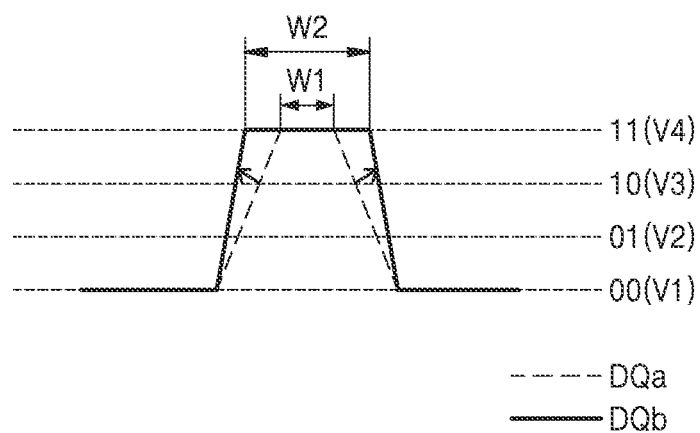

FIGS. 12A and 12B are diagrams illustrating a characteristic change of a DQ signal according to an operating environment of a memory device.

Referring to FIG. 12A, second and third levels V2' and V3', which are intermediate levels of the DQ signal, may be lower than ideal levels V2 and V3 according to the operating environment of the memory device. Accordingly, the second and third levels V2' and V3' of the DQ signal need to be increased compared to before such that the DQ signal has a target level separation mismatch ratio, and thus, an eye-opening height may be sufficiently secured. However, this is only an embodiment, and is not limited thereto, and various situations in which the level of the DQ signal needs to be increased or decreased may occur.

Referring further to FIG. 12B, the DQ signal may transition from the first level V1 to the fourth level V4 according to the operating environment of the memory device, and when the DQ signal transitions from the fourth level V4 to the first level V1, a slope of the DQ signal is low, which may greatly reduce a width W1 maintaining the fourth level V4. Accordingly, the DQ signal has a sufficient width W2 by increasing the slope of the DQ signal than before, and thus the eye-opening width of the DQ signal may be sufficiently secured.

A driver according to the embodiment may include additional pull-up circuits or additional pull-down circuits in order to compensate for a characteristic deterioration of the DQ signal occurred in FIGS. 12A and 12B.

Figure 13A:
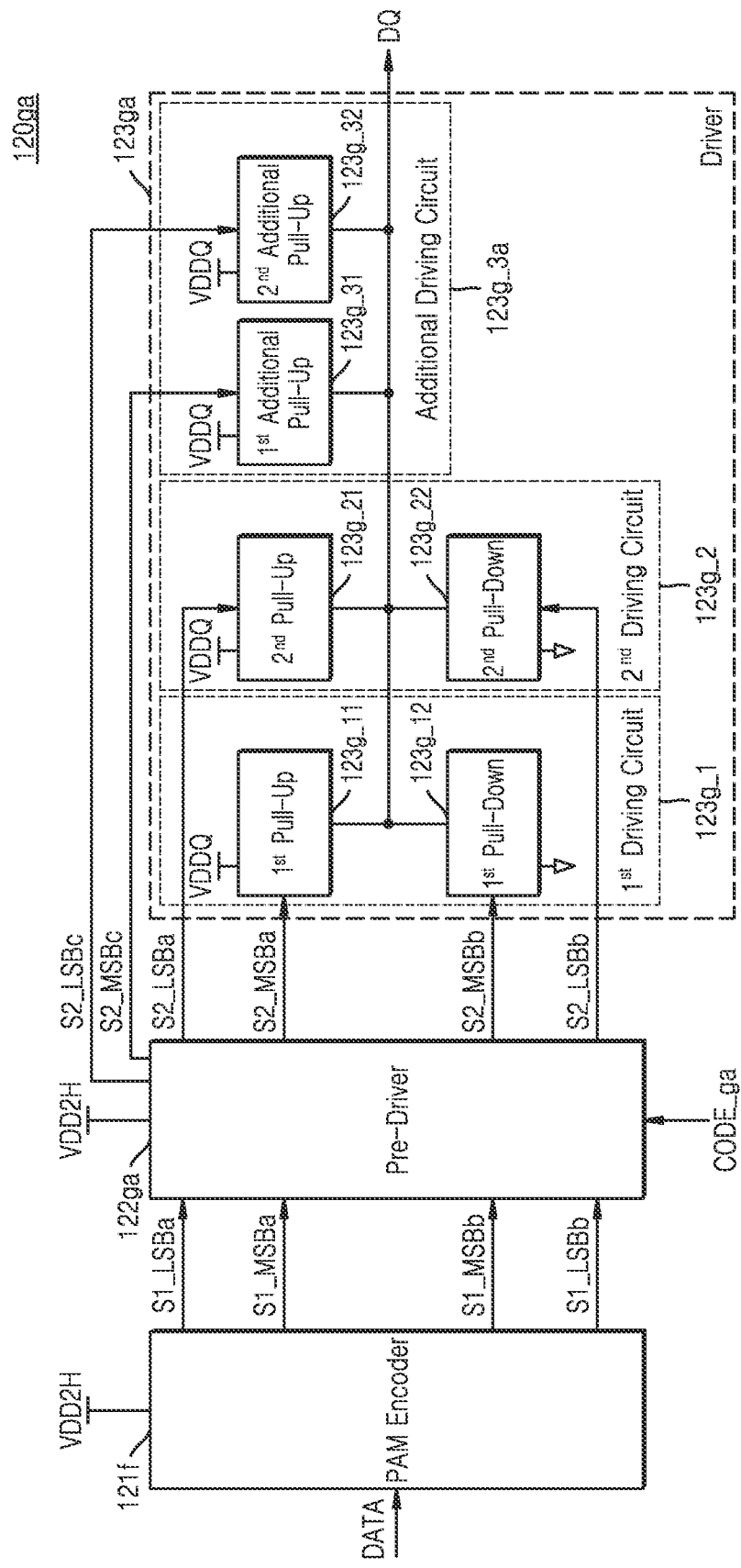
FIGS. 13A and 13B are block diagrams of transmitters illustrating example of drivers further including additional pull-up circuits or additional pull-down circuits.
Figure 13B:
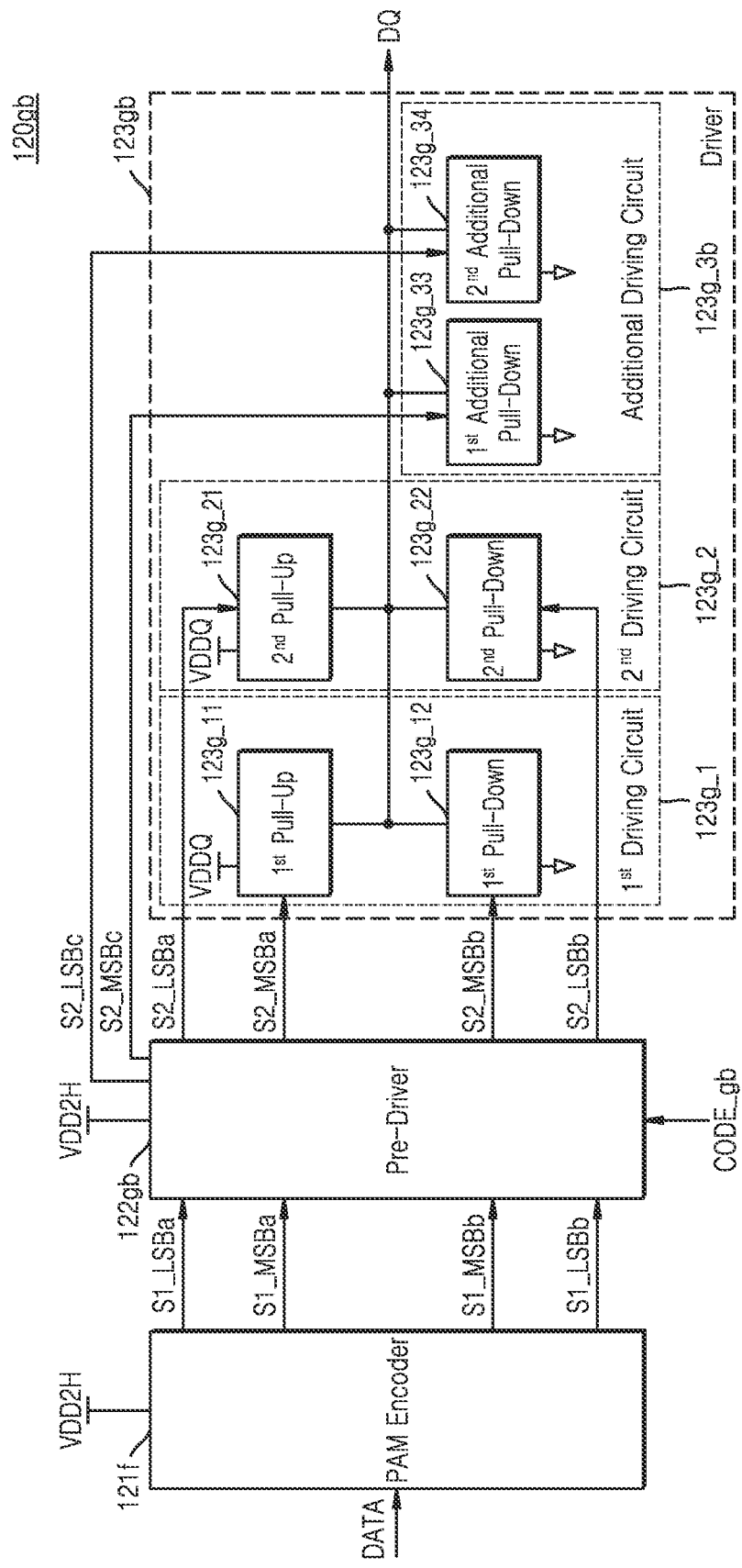

FIGS. 13A and 13B are block diagrams of transmitters 120ga and 120gb illustrating example of drivers 123ga and 123gb further including additional pull-up circuits or additional pull-down circuits.

Referring to FIG. 13A, the transmitter 120ga may include the PAM encoder 121f, a pre-driver 122ga, and the driver 123ga. The driver 123ga may include first and second driving circuits 123g_1 and 123g_2 and an additional driving circuit 123g_3a. The additional driving circuit 123g_3a may include first and second additional pull-up circuits 123g_31 and 123g_32 to which the second power voltage VDDQ is directly provided. The pre-driver 122ga may generate second input signals S2_MSBa, S2_MSBb, S2_LSBa, S2_LSBb, S2_MSBc, and S2_LSBc based on the first input signals S1_MSBa, S1_MSBb, S1_LSBa, and S1_LSBb and a calibration code signal CODE_ga. The first and second additional pull-up circuits 123g_31 and 123g_32 respectively receive the fifth MSB signal S2_MSBc and the fifth LSB signal S2_LSBc, and in response thereto, adjust intermediate levels and transition slopes of the DQ signal DQ such that the DQ signal DQ may secure sufficient eye-opening height and width, thereby supplementing the first and second pull-up circuits 123g_11 and 123g_21.

Referring further to FIG. 13B, when comparing the driver 123gb to the driver 123ga of FIG. 13A, an additional driving circuit 123g_3b may include additional first and second pull-down circuits 123g_33 and 123g_34 that are grounded. The pre-driver 122gb may generate second input signals S2_MSBa, S2_MSBb, S2_LSBa, S2_LSBb, S2_MSBc, and S2_LSBc based on the first input signals S1_MSBa, S1_MSBb, S1_LSBa, and S1_LSBb and a calibration code signal CODE_gb. The first and second additional pull-down circuits 123g_33 and 123g_34 may respectively receive the sixth MSB signal S2_MSBc and the sixth LSB signal S2_LSBc, and in response thereto, adjust intermediate levels and transition slopes of the DQ signal DQ such that the DQ signal DQ may secure sufficient eye-opening height and width, thereby supplementing the first and second pull-down circuits 123g_12 and 123g_22.

The additional driving circuits 123g_3a and 123g_3b respectively shown in FIGS. 13A and 13B are merely embodiments, and are not limited thereto. The additional driving circuits 123g_3a and 123g_3b may be implemented in various ways to improve the characteristics of the DQ signal DQ by supplementing the first and second driving circuits 123g_1 and 123g_2.

Figure 14A:
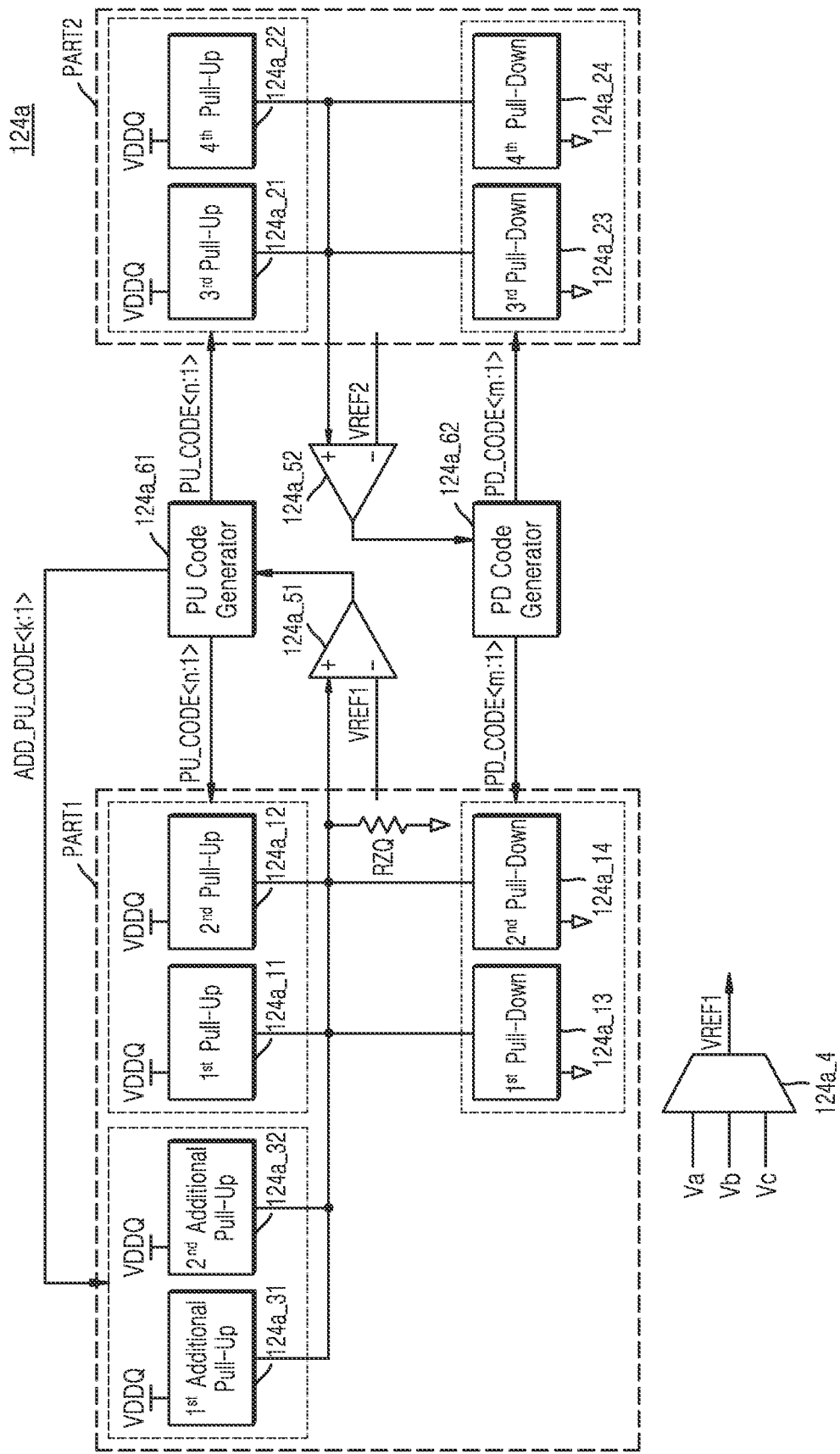
FIGS. 14A and 14B are block diagrams illustrating calibration circuits according to an embodiment.
Figure 14B:
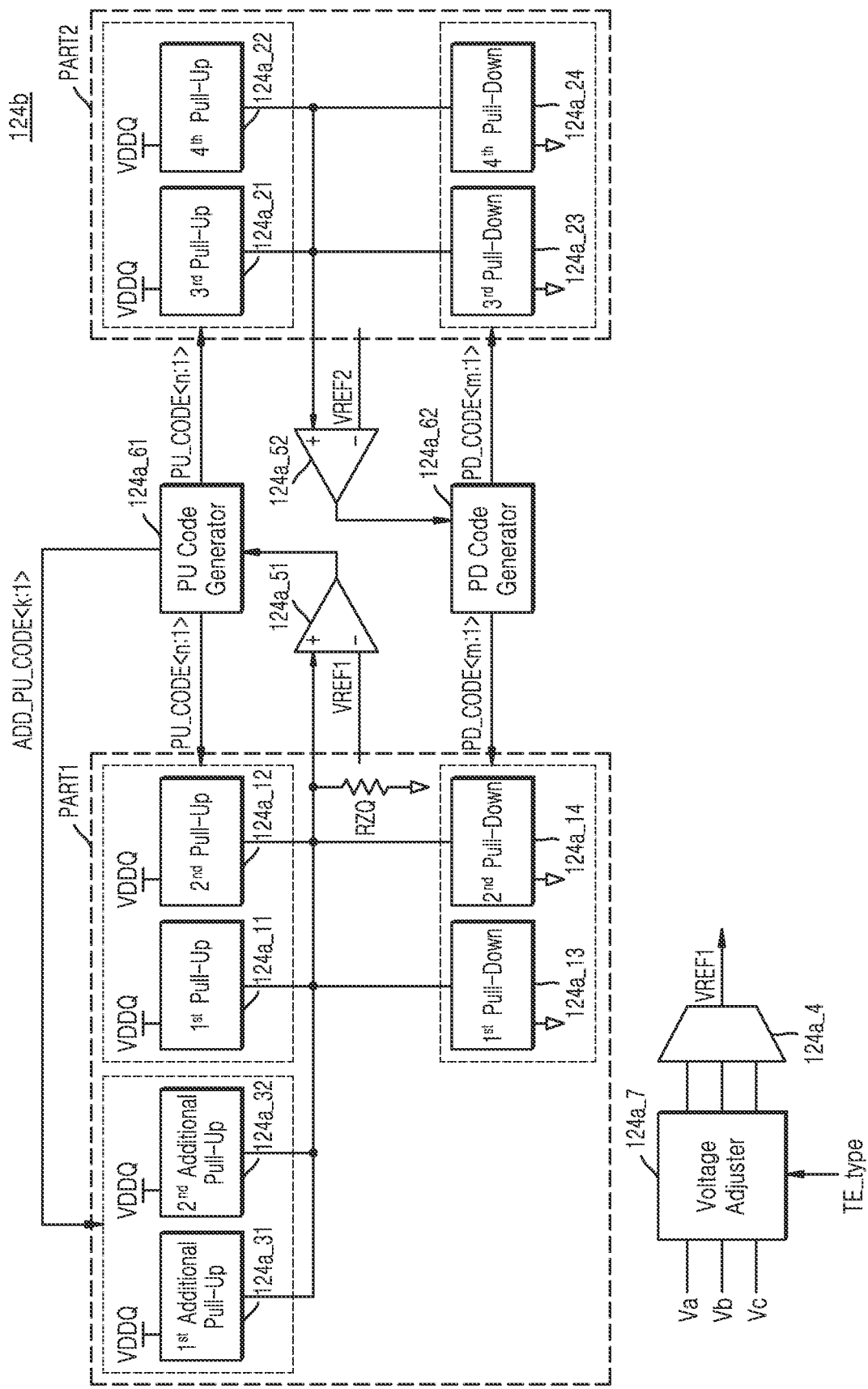

FIGS. 14A and 14B are block diagrams illustrating calibration circuits 124a and 124b according to an embodiment. FIGS. 14A and 14B show examples of the calibration circuits 124a and 124b corresponding to the configuration of the driver 120ga of FIG. 13A, which is only an embodiment, but is not limited thereto. The calibration circuits 124a and 124b may be implemented in various ways according to the configuration of a driver.

Referring to FIG. 14A, the calibration circuit 124a may include first to fourth pull-up replica circuits 124a_11, 124a_12, 124a_21, and 124a_22, first to fourth pull-down replica circuits 124a_13, 124a_14, 124a_23, and 124a_24, first and second additional pull-up replica circuits 124a_31 and 124a_32, a multiplexer 124a_4, first and second comparators 124a_51 and 124a_52, a pull-up code generator 124a_61, and a pull-down code generator 124a_62.

The first and third pull-up replica circuits 124a_11 and 124a_21 may be circuits replicated from the first pull-up circuit 123g_11 of FIG. 13A, and the second and fourth pull-up replica circuits 124a_12 and 124a_22 may be circuits replicated from the second pull-up circuit 123g_21 of FIG. 13A. The first and third pull-down replica circuits 124a_13 and 124a_23 may be circuits replicated from the first pull-down circuit 123g_12 of FIG. 13A, and the second and fourth pull-down replica circuits 124a_14 and 124a_24 may be circuits replicated from the second pull-down circuit 123g_22 of FIG. 13A. The first and second additional pull-up replica circuits 124a_31 and 124a_32 may be circuits replicated from the first and second additional pull-up circuits 123g_31 and 123g_32 of FIG. 13A. A replicated circuit generically refers to a circuit including transistors having the same characteristics as transistors included in a target circuit, or having the same connection structure in which the transistors of the target circuit have the same connection relationship.

The pull-up code generator 124a_61 may generate and provide a pull-up code PU_CODE<n:1> to the first to fourth pull-up replica circuits 124a_11, 124a_12, 124a_21, and 124a_22, and generate and provide an additional pull-up code ADD_PU_CODE<k:1> to the first and second additional pull-up replica circuits 124a_31 and 124a_32. The pull-down code generator 124a_62 may generate and provide a pull-down code PD_CODE<m:1> to the first to fourth pull-down replica circuits 124a_13, 124a_14, 124a_23, and 124a_24.

The first comparator 124a_51 may compare a signal generated in a first part PART1 and a first reference voltage, and provide a comparison result to the pull-up code generator 124a_61. A resistor RZQ for calibration may be connected to an input terminal of the first comparator 124a_51 through an external pin (e.g., a ZQ pin). For example, the resistor RZQ may have a resistance value of 40Ω. The second comparator 124a_52 may compare a signal generated in a second part PART2 to a second reference voltage, and provide a comparison result to the pull-down code generator 124a_62. The first part PART1 may be a concept including the first and second pull-up replica circuits 124a_11 and 124a_12, the first and second pull-down replica circuits 124a_13 and 124a_14, and the first and second additional pull-ups replica circuits 124a_31 and 124a_32, and the second part PART2 may be a concept including the third and fourth pull-up replica circuits 124a_21 and 124a_22, and the third and fourth pull-down replica circuits 124a_23 and 124a_24.

The multiplexer 124a_4 may select and provide any one of the first to third voltages Va, Vb, and Vc to the first comparator 124a_51 as the first reference voltage VREF1. The first to third voltages Va, Vb, and Vc may have levels necessary to check a level of the DQ signal. For example, in the case of FIG. 7A, the first voltage Va may correspond to the level Vaa for distinguishing the second level V2a and the third level V3a, the second voltage Vb may correspond to the level Vba for distinguishing the first level V1a and the second level V2a, and the third voltage Vc may correspond to the level Vca for distinguishing the third level V3a and the fourth level V4a. Meanwhile, the second reference voltage VREF2 may correspond to the first voltage Va. In some embodiments, the calibration circuit 124a may further include a reference voltage generator that generates at least one of the first to third voltages Va, Vab, and Vc.

The pull-up code generator 124a_61 and the pull-down code generator 124a_62 may change values of the pull-up code PU_CODE<n:1>, the pull-down code PD_CODE<m:1> and the additional pull-up code ADD_PU_CODE<k:1> according to levels of signals output from the first and second parts PART1 and PART2, thereby determining a calibration code signal by which the DQ signal has a target level separation mismatch ratio. In some embodiments, the pull-up code PU_CODE<n:1>, the pull-down code PD_CODE<m:1> and the additional pull-up code ADD_PU_CODE<k:1> may have the same bit or different bits. Meanwhile, the pull-up code PU_CODE<n:1>, the pull-down code PD_CODE<m:1> and the additional pull-up code ADD_PU_CODE<k:1> are described as codes of 'n', 'm', and 'k' bits, respectively, but this is only an embodiment, and the pull-up code PU_CODE<n:1>, the pull-down code PD_CODE<m:1> and the additional pull-up code ADD_PU_CODE<k:1> may be set to have various number of bits according to the configuration of the calibration circuit 124a.

Referring further to FIG. 14B, the calibration circuit 124b may further include a voltage adjustor 124a_7 compared to FIG. 14A. As shown in FIGS. 7A to 7C, when the type of a termination element of a memory controller varies, because a swing period of the DQ signal varies, levels of the first and second reference voltages VREF1 and VREF2 used by the calibration circuit 124b may also vary depending on the type of termination element of the memory controller.

As described above with reference to FIG. 8, in an embodiment, the voltage adjustor 124a_7 may change levels of the first to third voltages Va, Vb, and Vc based on the first setting signal TE_type to provide the first to third voltages Va, Vb, and Vc to the multiplexer 124a_7. For example, on the assumption that the levels of the first to third voltages Va, Vb, and Vc correspond to Wm', 'Vba', and 'Vca' of FIG. 7A, respectively, the voltage adjustor 124a_7 may adjust the levels of the first to third voltages Va, Vb, and Vc to 'Vab', 'Vbb', and 'Vcb', respectively, in FIG. 7B and to 'Vac', 'Vbc', and 'Vcc', respectively, in FIG. 7C.

The transmitter according to the embodiment may output a DQ signal having various swing periods according to the type of the termination element of the memory controller through the calibration circuit 124b as shown in FIG. 14B.

FIGS. 15A to 15D are diagrams illustrating a calibration method different from a calibration method of FIG. 14A according to an embodiment. Hereinafter, for convenience of understanding, it is assumed that calibration is for generating a DQ signal of FIG. 7A. Hereinafter, an embodiment using first and second calibration circuits 124c_1 and 124c_2 having the configuration different from that of FIGS. 14A and 14B and a resistor RZQ' of 240Ω will be described. However, this is only an embodiment, and a resistor having a resistance value (e.g., 120Ω) defined in various memory standard specifications may be connected to the first calibration circuit 124c_1.

Figure 15A:
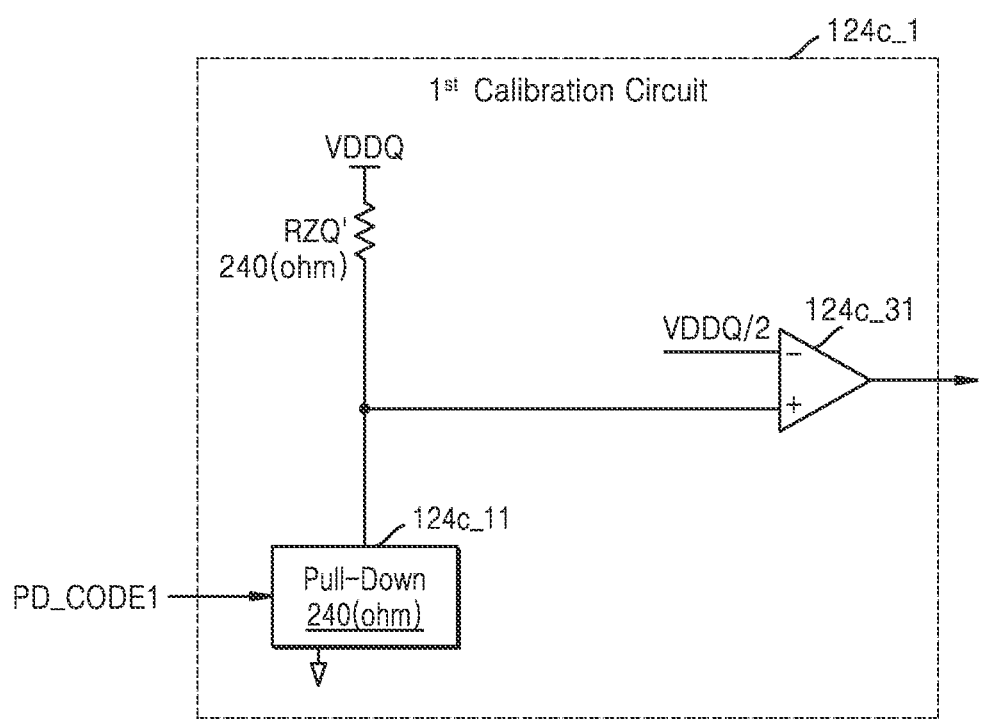
FIGS. 15A to 15D are diagrams illustrating a calibration method different from a calibration method of FIG. 14A according to an embodiment.

Referring to FIG. 15A, the first calibration circuit 124c_1 may be connected to the resistor RZQ' of 240Ω through a ZQ pin, and the first comparator 124c_31 can receive a voltage corresponding to half of the second power voltage VDDQ. The first calibration circuit 124c_1 may calibrate the first pull-down code PD_CODE1 so that the pull-down replica circuit 124c_11 is set to 240Ω using the first comparator 124c_31. The first pull-down code PD_CODE1 may correspond to a reference code for generating other pull-down codes.

Figure 15B:
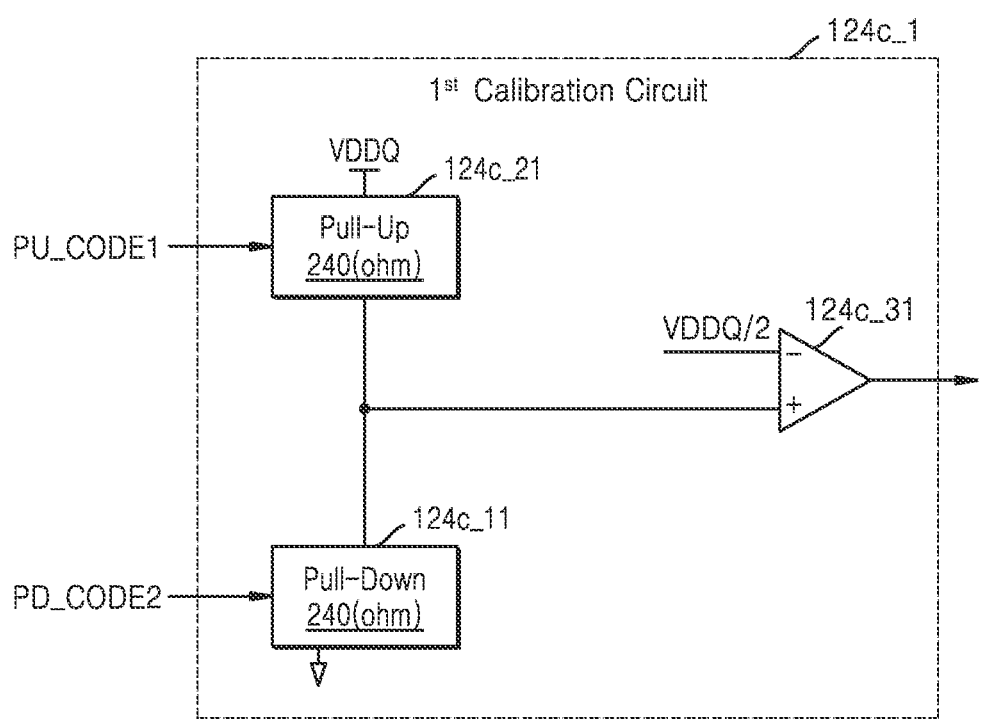

Referring further to FIG. 15B, the first calibration circuit 124c_1 is disconnected from the resistor RZQ', and the first calibration circuit 124c_1 may calibrate the first pull-up code PU_CODE1 so that the pull-up replica circuit 124c_21 is set to 240Ω using the first comparator 124c_31. The first pull-up code PU_CODE1 may correspond to a reference code for generating other pull-up codes.

Figure 15C:
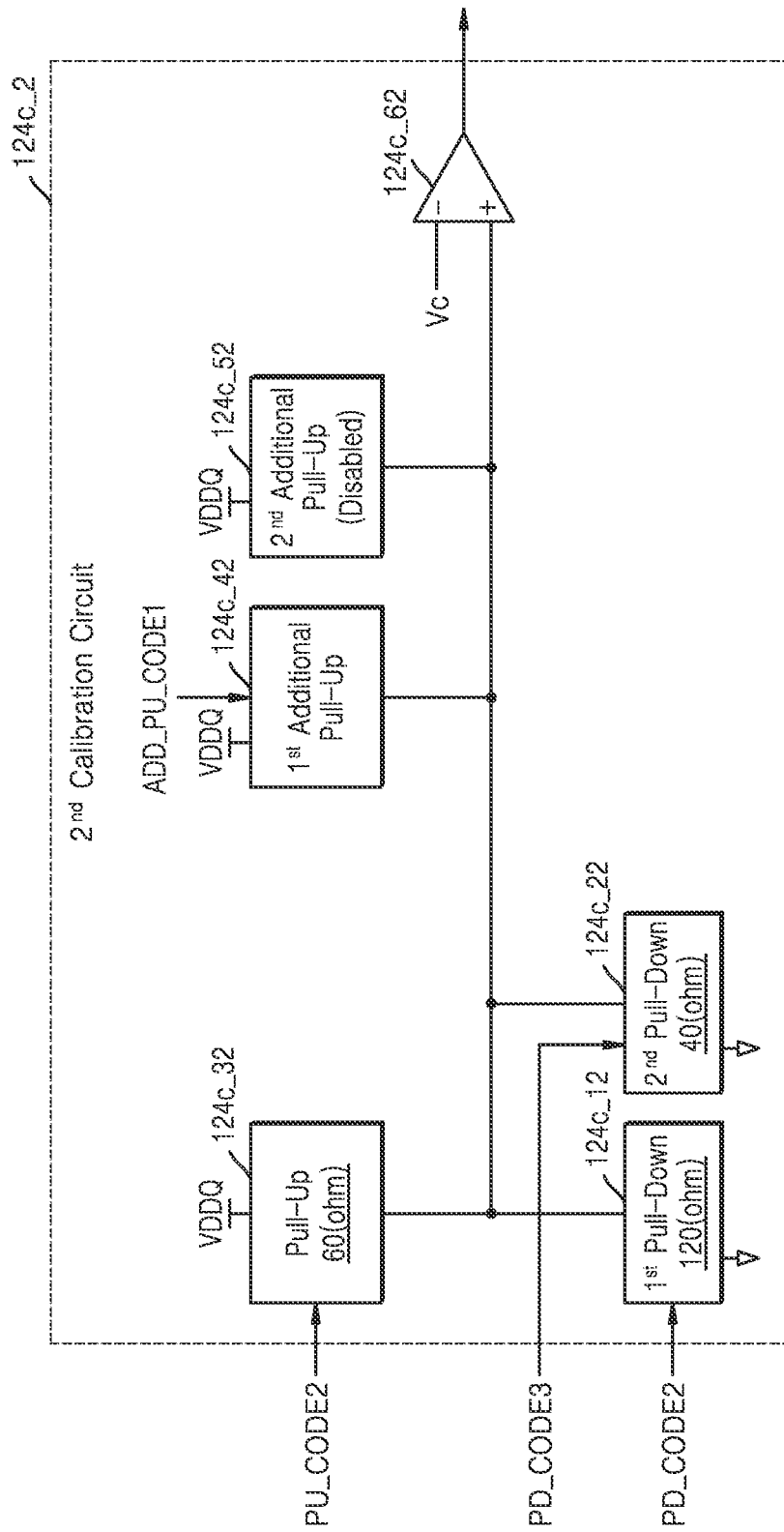

Referring further to FIG. 15C, the second comparator 124c_62 may receive the third voltage Vc, the second calibration circuit 124c_2 may generate a second pull-down code PD_CODE2 for setting the first pull-down replica circuit 124c_12 to 120Ω, a third pull-down code PD_CODE3 for setting the second pull-down replica circuit 124c_22 to 40Ω, and a second pull-up code PU_CODE2 for setting the pull-up replica circuit 124c_32 to 60Ω, based on the first pull-down code PD_CODE1 and the first pull-up code PU_CODE1. Thereafter, the second calibration circuit 124c_2 may calibrate a first additional pull-up code ADD_PU_CODE1 provided to the first additional pull-up replica circuit 124c_42 using the second comparator 124c_62 to adjust a certain level (e.g., the third level V3a in FIG. 7A) so that the DQ signal has a target level separation mismatch ratio. Meanwhile, the second additional pull-up replica circuit 124c_52 may be in a deactivated state.

Figure 15D:
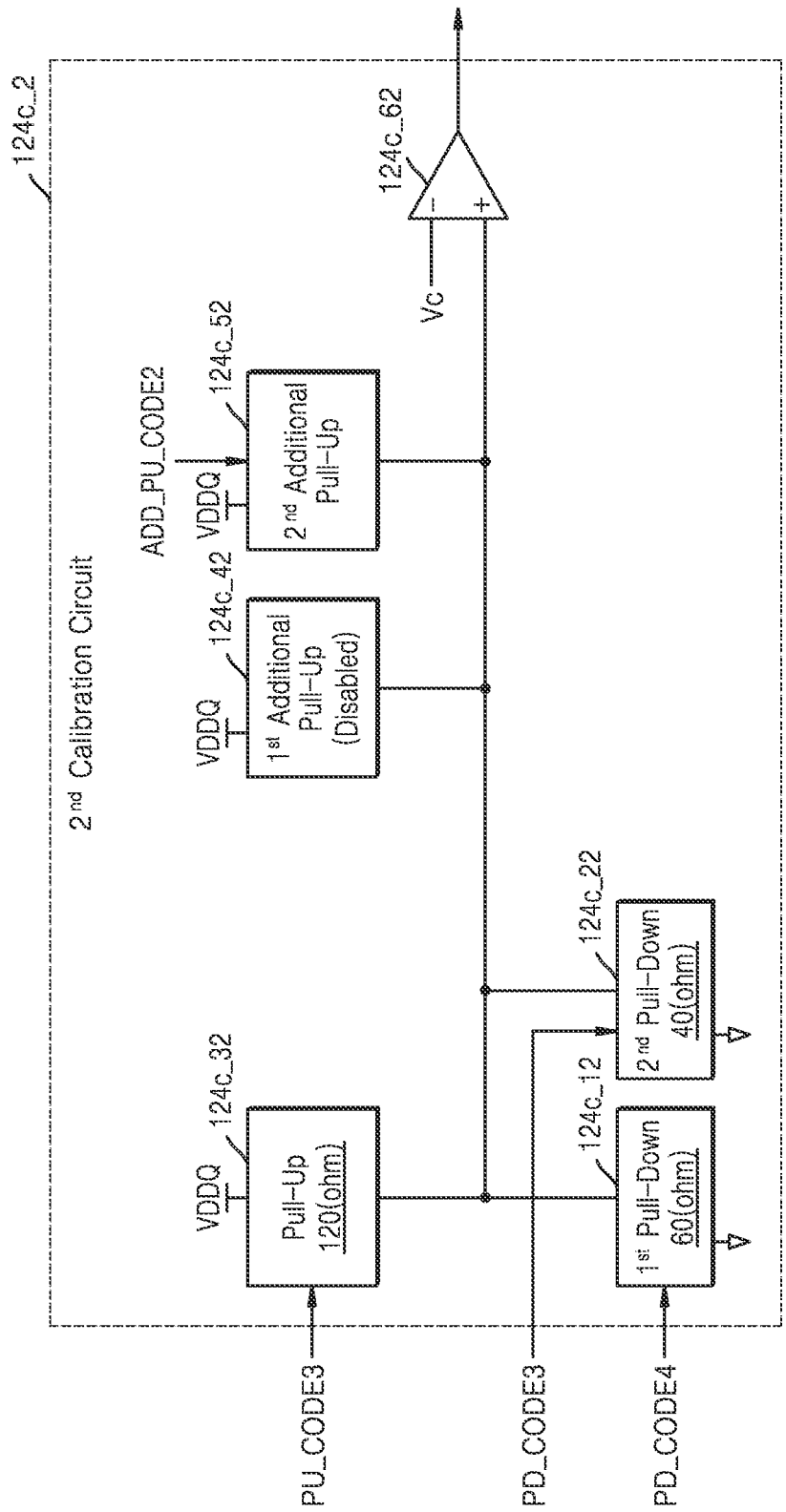

Referring further to FIG. 15D, the second comparator 124c_62 may receive the second voltage Vb, and the calibration circuit 124c_2 may generate a fourth pull-down code PD_CODE4 for setting the first pull-down replica circuit 124c_12 to 60Ω, the third pull-down code PD_CODE3 for setting the second pull-down replica circuit 124c_22 to 40Ω, and the third pull-up code PU_CODE3 for setting the pull-up replica circuit 124c_32 to 120Ω, based on the first pull-down code PD_CODE1 and the first pull-up code PU_CODE1. Thereafter, the second calibration circuit 124c_2 may calibrate a second additional pull-up code ADD_PU_CODE2 provided to the second additional pull-up replica circuit 124c_52 using the second comparator 124c_62 to adjust a certain level (e.g., the second level V2a in FIG. 7A) so that the DQ signal has the target level separation mismatch ratio. Meanwhile, the first additional pull-up replica circuit 124c_42 may be in a deactivated state.

Figure 16A:
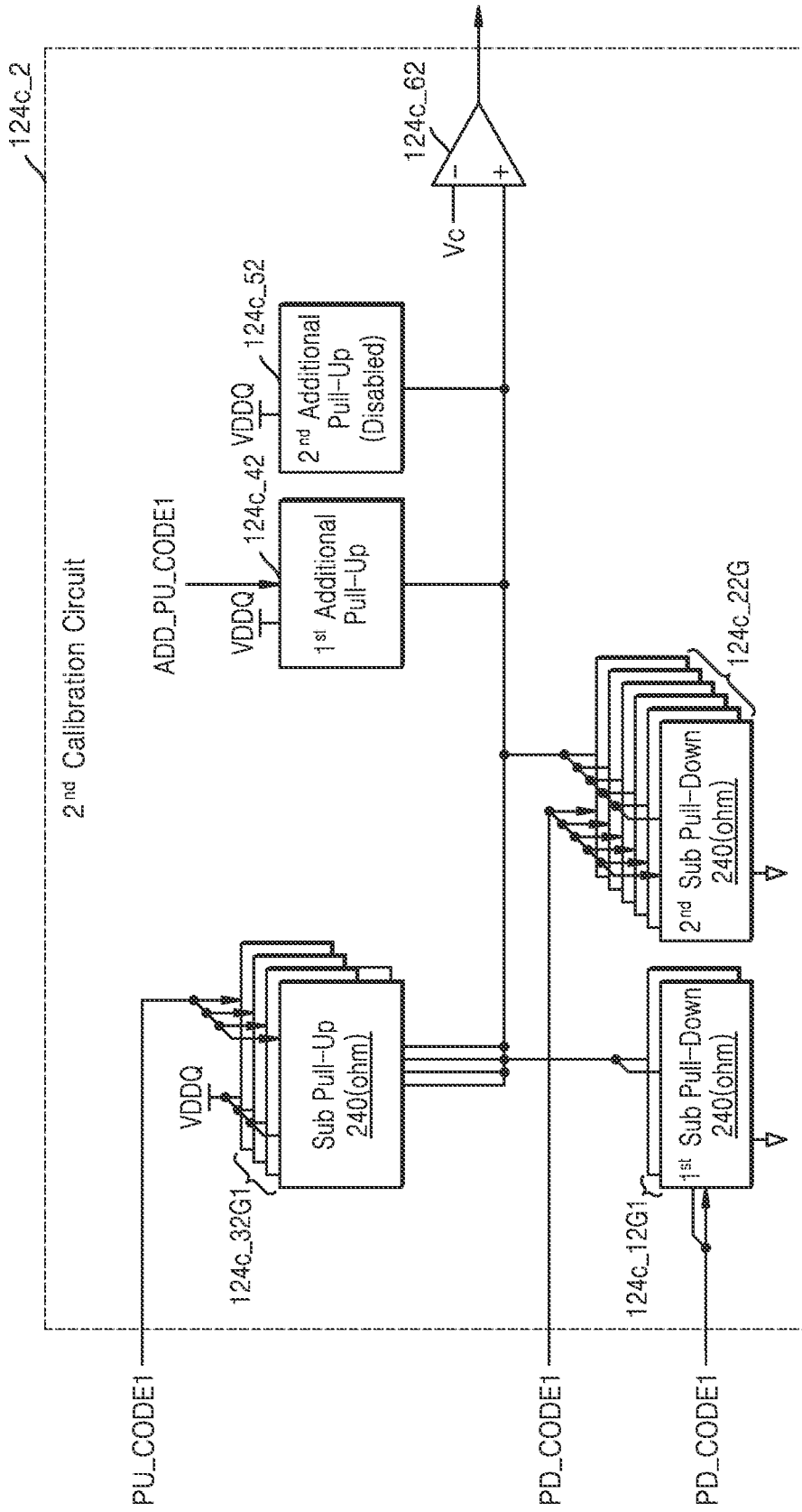
FIGS. 16A and 16B are diagrams illustrating examples of a pull-up replica circuit and a pull-down replica circuit respectively in FIGS. 15C and 15D.
Figure 16B:
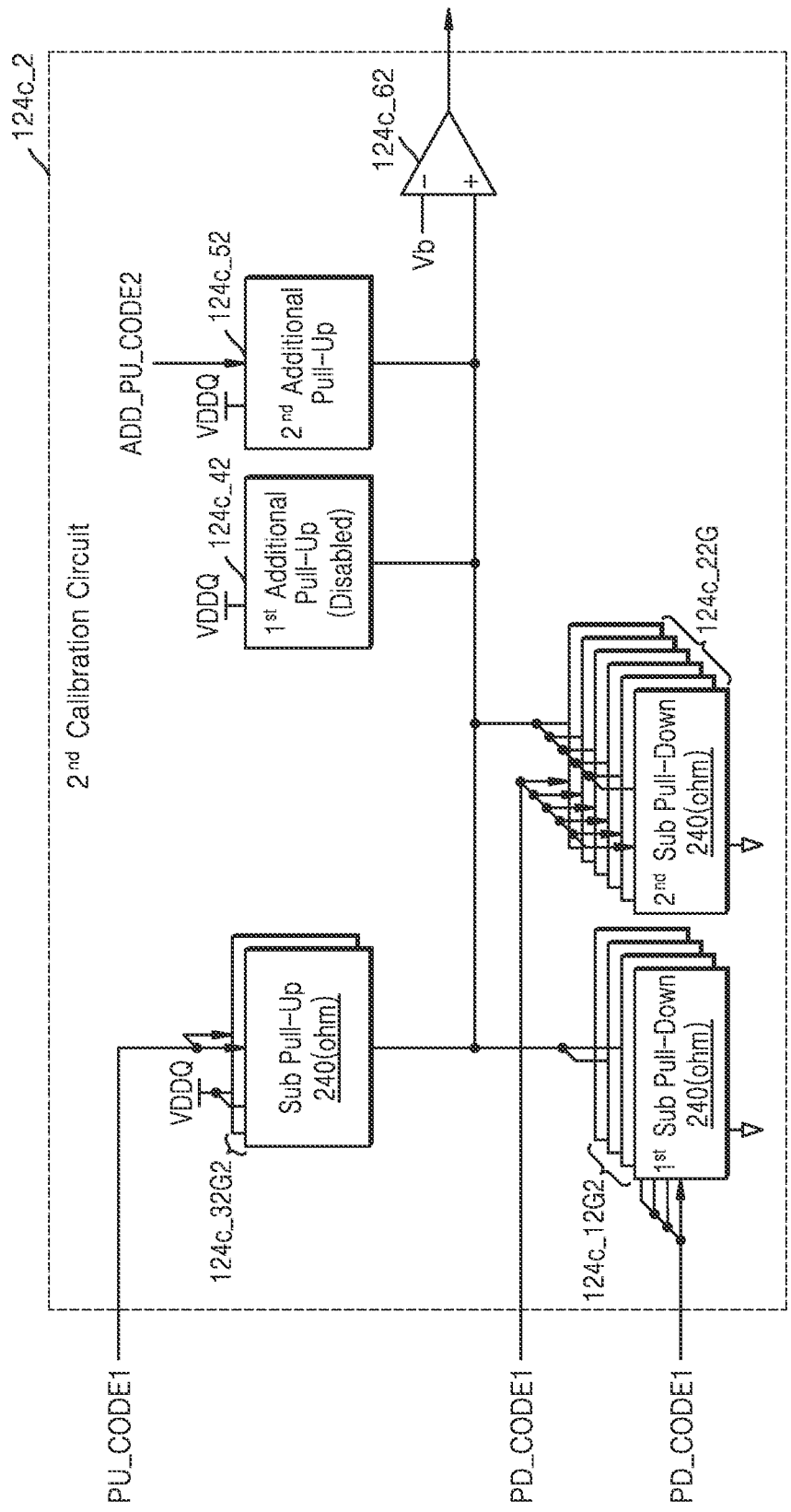

FIGS. 16A and 16B are diagrams illustrating examples of a pull-up replica circuit and a pull-down replica circuit respectively in FIGS. 15C and 15D. FIG. 16A corresponds to the embodiment of FIG. 15C, and FIG. 16B corresponds to the embodiment of FIG. 15D.

Referring to FIG. 16A, the first pull-down replica circuit 124c_12 (FIG. 15C) may include a plurality of first sub pull-down replica circuits connected in parallel with each other, and the first pull-down code PD_CODE1 may be provided to two first sub pull-down replica circuits 124c_12G1 among the plurality of first sub pull-down replica circuits. The two first sub pull-down replica circuits 124c_12G1 may be each activated and set to 240Ω, and as a result, the first pull-down replica circuit 124c_12 (FIG. 15C) may be set to 120Ω. The second pull-down replica circuit 124c_22 (FIG. 15C) may include a plurality of second sub pull-down replica circuits connected in parallel with each other, and the first pull-down code PD_CODE1 may be provided to six second sub pull-down replica circuits 124c_22G among the plurality of second sub pull-down replica circuits. The six second sub pull-down replica circuits 124c_22G may be each activated and set to 240Ω, and as a result, the second pull-down replica circuit 124c_22 (FIG. 15C) may be set to 40Ω. The pull-up replica circuit 124c_32 (FIG. 15C) may include a plurality of sub pull-up replica circuits connected in parallel with each other, and the first pull-up code PU_CODE1 may be provided to four sub pull-up replica circuits 124c_32G1 among the plurality of sub pull-up replica circuits. The four sub pull-up replica circuits 124c_32G1 may be each activated and set to 240Ω, and as a result, the pull-up replica circuit 124c_32 (FIG. 15C) may be set to 60Ω.

Referring to FIG. 16B, the first pull-down replica circuits 124c_12 (FIG. 15D) may include a plurality of first sub pull-down replica circuits connected in parallel with each other, and the first pull-down code PD_CODE1 may be provided to four first sub pull-down replica circuits 124c_12G2 among the plurality of first sub pull-down replica circuits. The four first sub pull-down replica circuits 124c_12G2 may be each activated and set to 240Ω, and as a result, the first pull-down replica circuit 124*c*_12 (FIG. 15D) may be set to 60Ω. The six second sub pull-down replica circuits 124*c*_22G of the second pull-down replica circuit 124*c*_22 (FIG. 15D) may receive the first pull-down code PD_CODE1 and may be each activated to 240Ω, and as a result, the second pull-down replica circuit 124*c*_22 (FIG. 15D) may be set to 40Ω. The pull-up replica circuit 124*c*_32 (FIG. 15D) may include a plurality of sub pull-up replica circuits connected in parallel with each other, and the first pull-up code PU_CODE1 may be provided to two sub pull-up replica circuits 124*c*_32G2 among the plurality of sub pull-up replica circuits. The two sub pull-up replica circuits 124*c*_32G2 may be each activated and set to 240Ω, and as a result, the pull-up replica circuit 124*c*_32 (FIG. 15D) may be set to 120Ω.

However, the embodiments shown in FIGS. 16A and 16B are merely embodiments, and are not limited thereto, and various implementations may be applied to a calibration circuit to calibrate the first and second additional pull-up codes ADD_PU_CODE1 and ADD_PU_CODE2.

Figure 17:
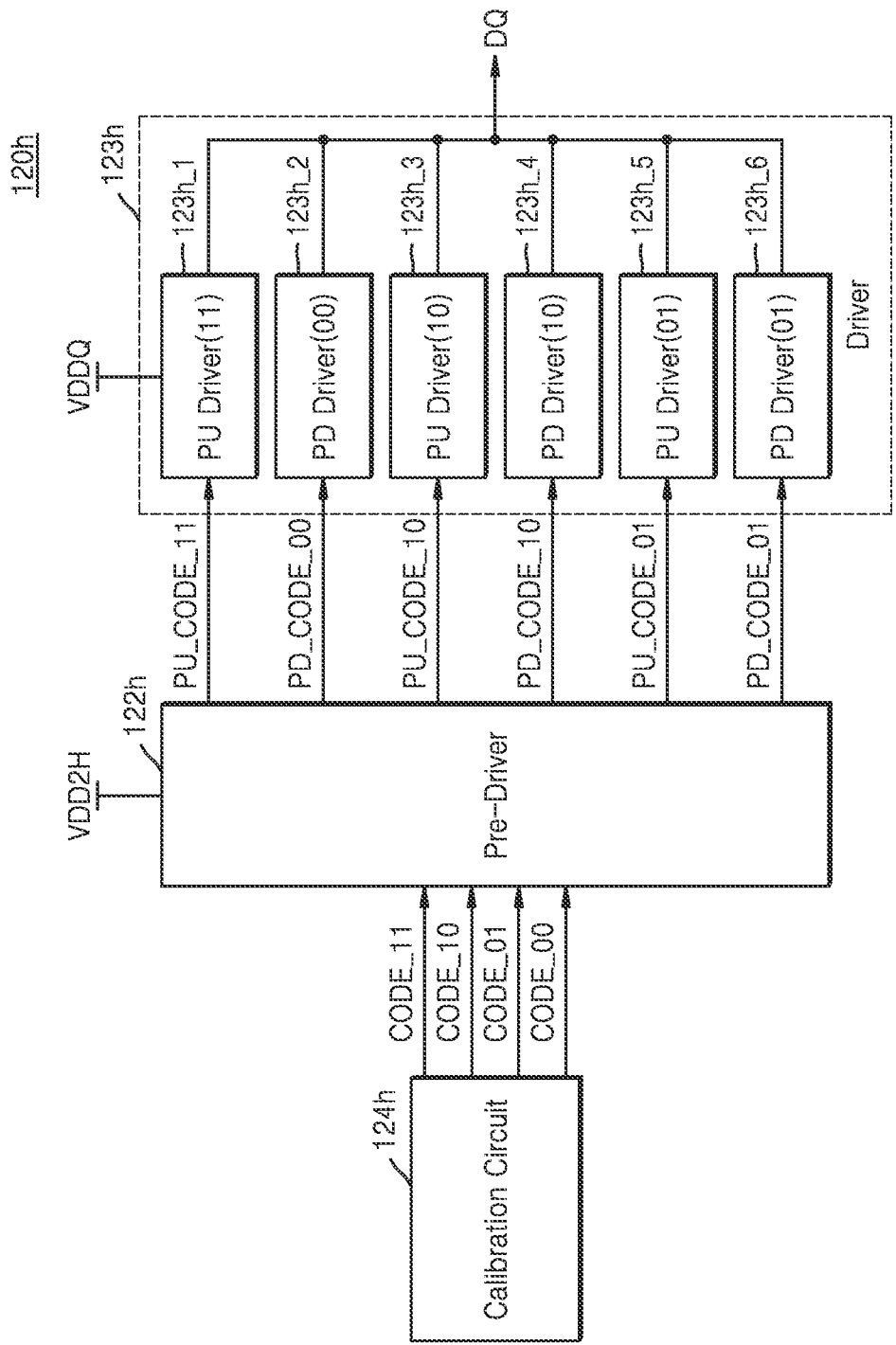
FIG. 17 is a block diagram illustrating an example of a transmitter according to an embodiment.

FIG. 17 is a block diagram illustrating an example of a transmitter 120*h* according to an embodiment.

Referring to FIG. 17, the transmitter 120*h* may include a pre-driver 122*h*, a driver 123*h*, and a calibration circuit 124*h*. The driver 123*h* may include a first pull-up driver circuit 123*h*_1 for exclusively outputting the DQ signal DQ having a level corresponding to a data value of '11', a first pull-down driver circuit 123*h*_2 for exclusively outputting the DQ signal DQ having a level corresponding to a data value of '00', a second pull-up driver circuit 123*h*_3 and a second pull-down driver circuit 123*h*_4 for exclusively outputting the DQ signal DQ having a level corresponding to a data value of '10', a third pull-up driver circuit 123*h*_5 and a third pull-down driver circuit 123*h*_6 for exclusively outputting the DQ signal DQ having a level corresponding to a data value of '01'. In other words, each of the first pull-up driver circuit 123*h*_1, first pull-down driver circuit 123*h*_2, second pull-up driver circuit 123*h*_3, second pull-down driver circuit 123*h*_4, third pull-up driver circuit 123*h*_5, and third pull-down driver circuit 123*h*_6 is configured to output a value corresponding to a single respective data value. For example, the first pull-up driver circuit 123*h*_1 outputs a value corresponding to data value '11' and does not output any value that corresponds to a data value other than '11'.

The calibration circuit 124*h* may provide first to fourth codes CODE_11, CODE_10, CODE_01, and CODE_00 for controlling the driver 123*h* individually configured to output the DQ signal DQ having a level corresponding to each data value to the pre-driver 122*h*. The first code CODE_11 may include a first pull-up code PU_CODE_11, the second code CODE_10 may include a second pull-up code PU_CODE_10 and a second pull-down code PD_CODE_10, the third code CODE_01 may include a third pull-up code PU_CODE_01 and a third pull-down code PD_CODE_01, and the fourth code CODE_00 may include a first pull-down code PD_CODE_00. The fourth code CODE_00 may be generated using a pull-up code generated when the DQ signal DQ is calibrated to have the level corresponding to the data value of '11'. The pre-driver 122*h* may provide the first pull-up code PU_CODE_11 to the first pull-up driver circuit 123*h*_1, provide the first pull-down code PD_CODE_00 to the first pull-down driver circuit 123*h*_2, provide the second pull-up code PU_CODE_10 to the second pull-up driver circuit 123*h*_3, provide the second pull-down code PD_CODE_10 to the second pull-down driver circuit 123*h*_4, provide the third pull-up code PU_CODE_01 to the third pull-up driver circuit 123*h*_5, and provide the third pull-down code PD_CODE_01 to the third pull-down driver circuit 123*h*_6.

FIGS. 18A to 18F are diagrams illustrating an example and an operating method of the calibration circuit 124*h* of FIG. 17.

Figure 18A:
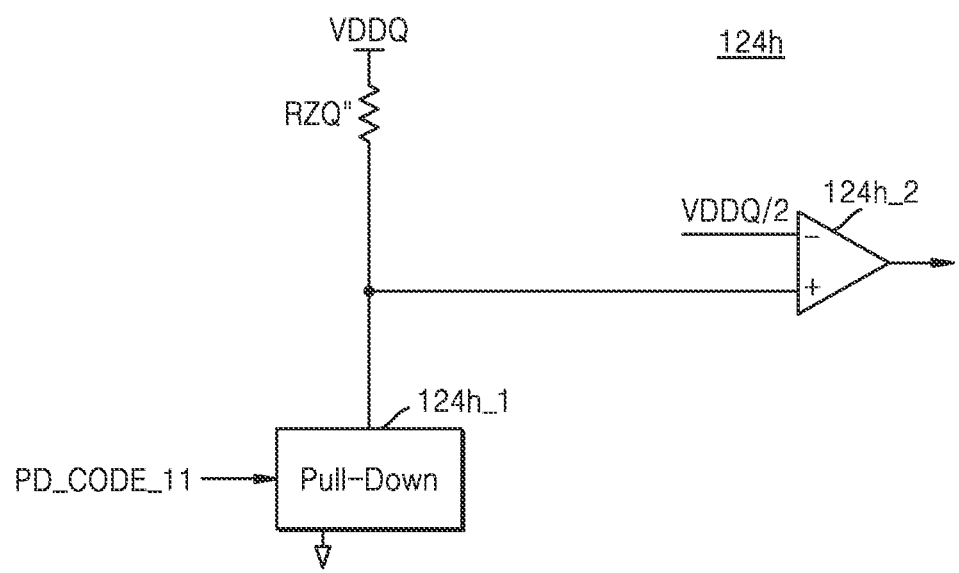
FIGS. 18A to 18F are diagrams illustrating an example and an operating method of the calibration circuit of FIG. 17.

Referring to FIG. 18A, the resistor RZQ" and the pull-down replica circuit 124*h*_1 may be connected to an input terminal of the comparator 124*h*_2 of the calibration circuit 124*h* for calibration through an external pin (for example, a ZQ pin). The comparator 124*h*_2 may receive a voltage corresponding to half of the second power voltage VDDQ. The calibration circuit 124*h* may use the comparator 124*h*_2 to calibrate the fourth pull-down code PD_CODE_11 so that the pull-down replica circuit 124*h*_1 is set to a certain resistance value (e.g., the same resistance value as that of the connected resistor RZQ").

Figure 18B:
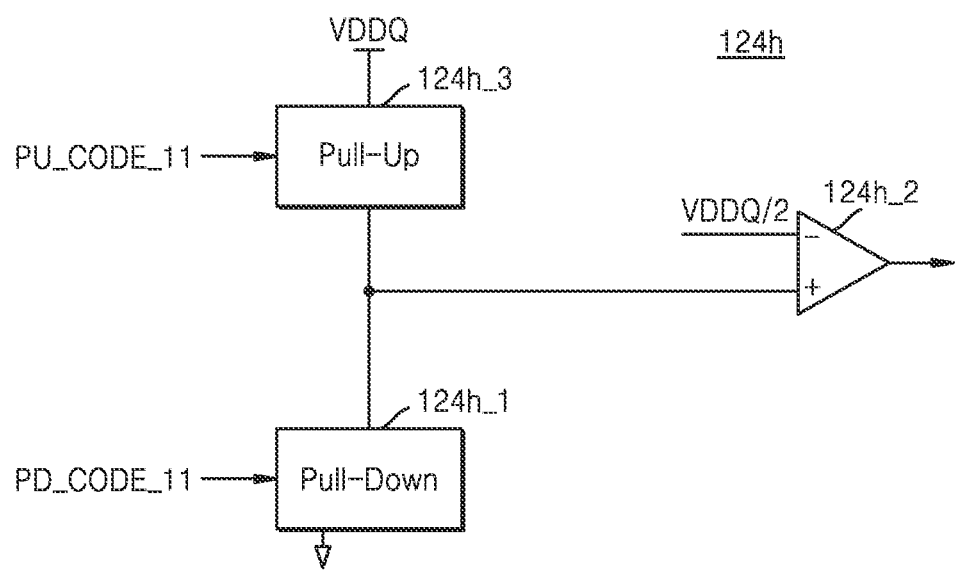

Referring further to FIG. 18B, the calibration circuit 124*h* may use the comparator 124*h*_2 to calibrate the first pull-down code PD_CODE_11 so that a resistance value of the pull-down replica circuit 124*h*_1 and a resistance value of the pull-up replica circuit 124*h*_3 have the same value.

Figure 18C:
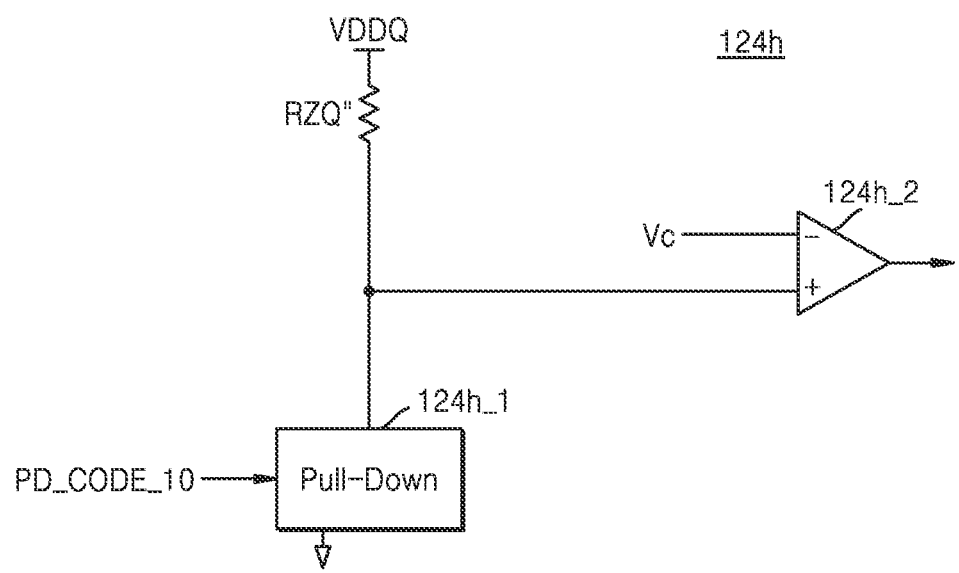

Referring further to FIG. 18C, the calibration circuit 124*h* may use the comparator 124*h*_2 to calibrate the second pull-down code PD_CODE_10 so that a ratio between the resistance value of the pull-down replica circuit 124*h*_1 and the resistance value of the resistor RZQ" connected through the ZQ pin matches a ratio between the third voltage Vc and the second power voltage VDDQ.

Figure 18D:
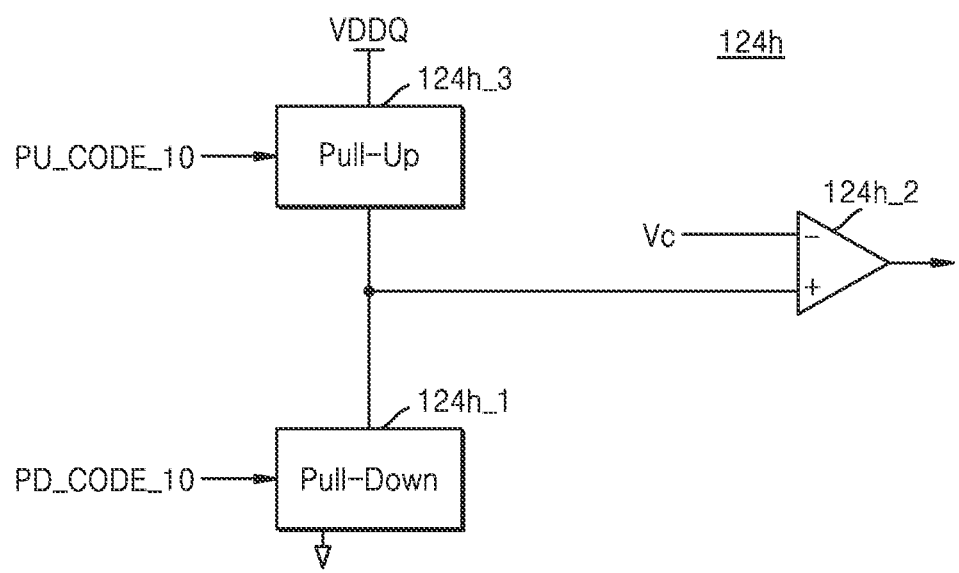

Referring further to FIG. 18D, the calibration circuit 124*h* may use the comparator 124*h*_2 to calibrate the second pull-up code PU_CODE_10 so that a ratio between the resistance value of the pull-down replica circuit 124*h*_1 and the resistance value of the pull-up replica circuit 124*h*_3 matches a ratio between the third voltage Vc and the second power voltage VDDQ.

Figure 18E:
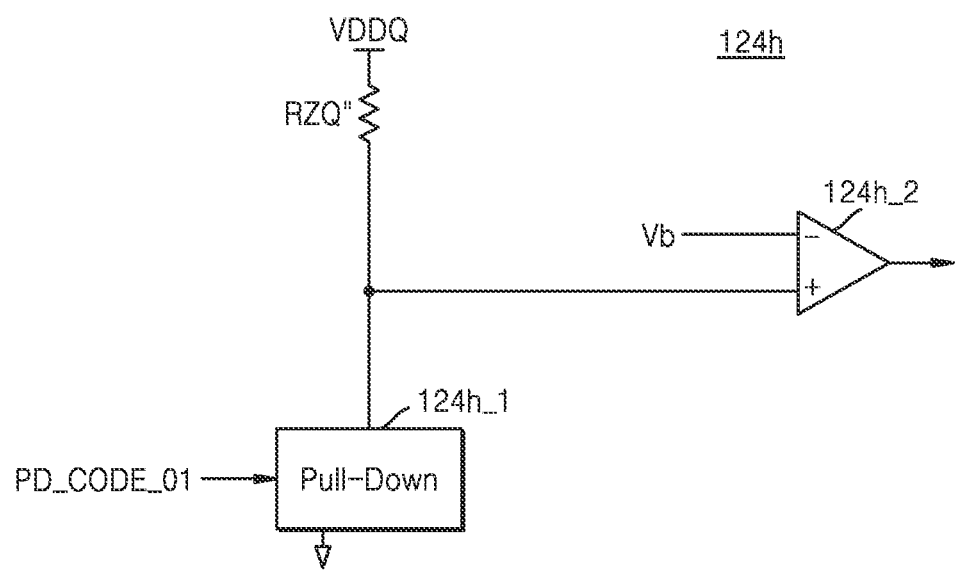

Referring further to FIG. 18E, the calibration circuit 124*h* may use the comparator 124*h*_2 to calibrate the third pull-down code PD_CODE_01 so that a ratio between the resistance value of the pull-down replica circuit 124*h*_1 and the resistance value of the resistor RZQ" connected through the ZQ pin matches a ratio between the second voltage Vb and the second power voltage VDDQ.

Figure 18F:
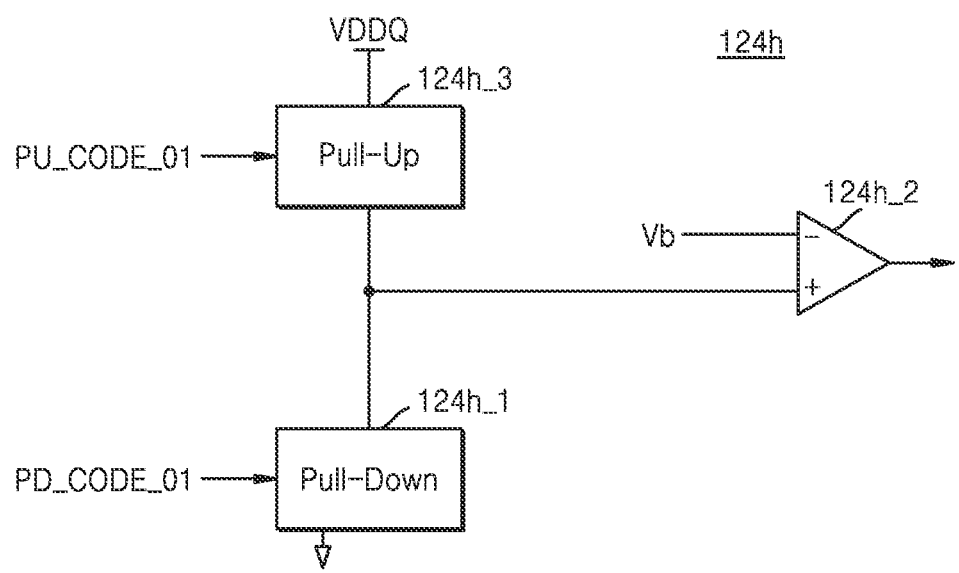

Referring further to FIG. 18F, the calibration circuit 124*h* may use the comparator 124*h*_2 to calibrate the third pull-up code PU_CODE_01 so that a ratio between the resistance value of the pull-down replica circuit 124*h*_1 and the resistance value of the pull-up replica circuit 124*h*_3 matches a ratio between the second voltage Vb and the second power voltage VDDQ.

Figure 19:
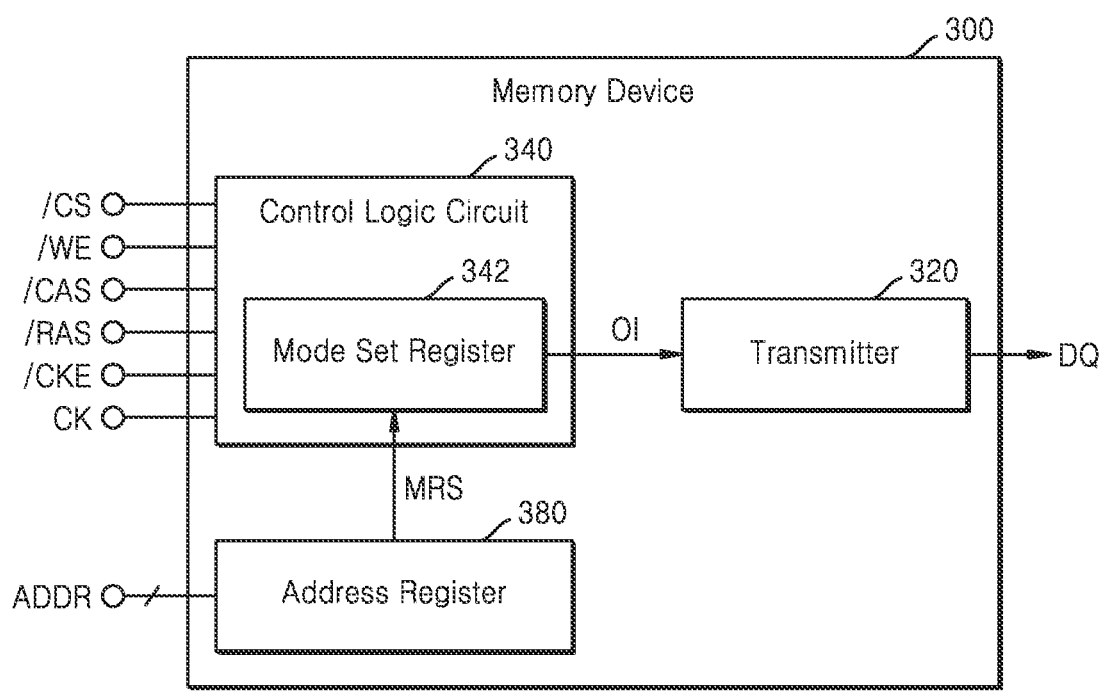
FIG. 19 is a block diagram of a memory device for receiving first and second setting signals according to an embodiment.

FIG. 19 is a block diagram of a memory device 300 for receiving first and second setting signals according to an embodiment.

Referring to FIG. 19, the memory device 300 may include a transmitter 320, a control logic circuit 340, and an address register 380. The control logic circuit 340 may include a mode set register 342. The control logic circuit 340 may receive and decode command-related signals applied from a memory controller, for example, a chip select signal/CS, a row address strobe signal/RAS, a column address strobe signal/CAS, a write enable signal/WE, and a clock enable signal/CKE to internally generate a decoded command.

The address register 380 may receive an address signal ADDR through a plurality of address pads of the memory device 300 and synchronize the received address signal ADDR with a main clock CK or an inversion clock signal to provide the address signal ADDR to the control logic circuit 340. Meanwhile, as an example, the address register 380 may receive an MRS signal MRS through address pads and may provide the received MRS signal MRS to the mode set register 342. The MRS signal MRS may be a signal for designating an operation mode of a mode register, and as described above, may include first and second setting signals SS for operation according to embodiments.

In an embodiment, the transmitter 320 may set a signaling mode based on the first and second set signals SS, and set a swing period of the DQ signal by checking a type of a termination element of the memory controller. The detailed operation of the transmitter 320 is described above and is omitted below.

Meanwhile, the example of FIG. 19 is only an embodiment, and is not limited thereto, and various examples in which the address register 380 directly transmits the first and second setting signals SS to the transmitter 320 may also be possible.

Figure 20A:
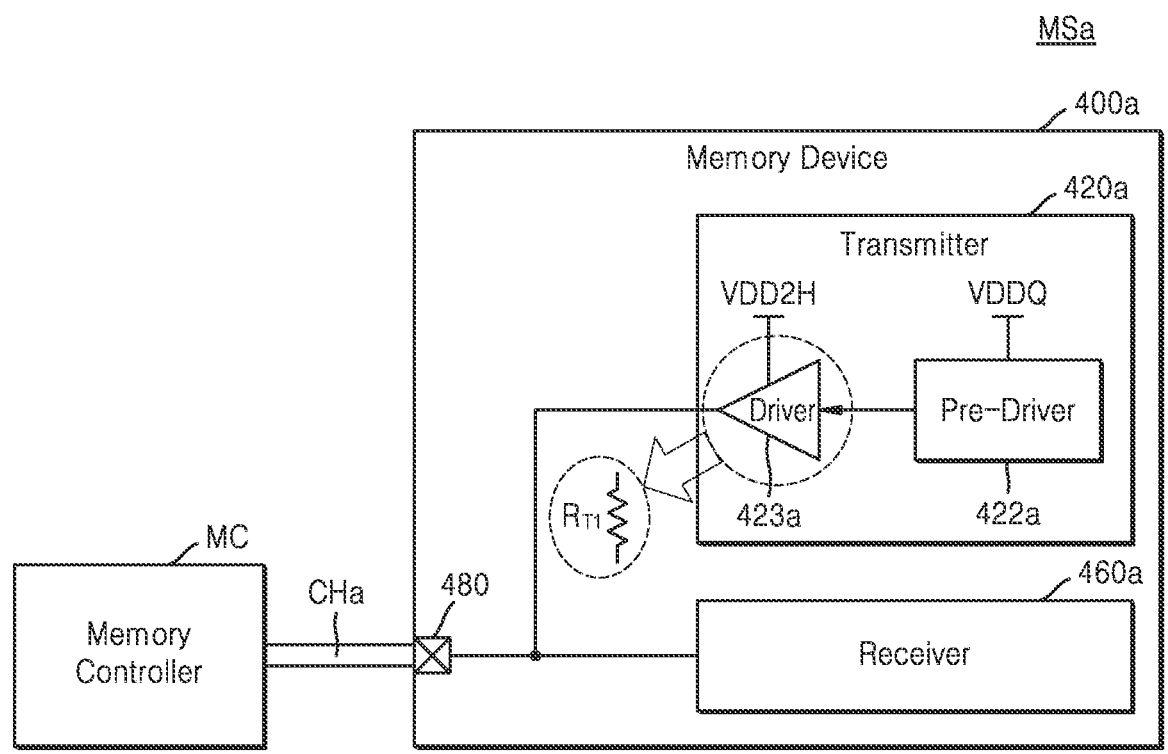
FIGS. 20A to 20C are block diagrams illustrating memory systems including a transmitter that performs an operation of a termination element according to an embodiment.
Figure 20B:
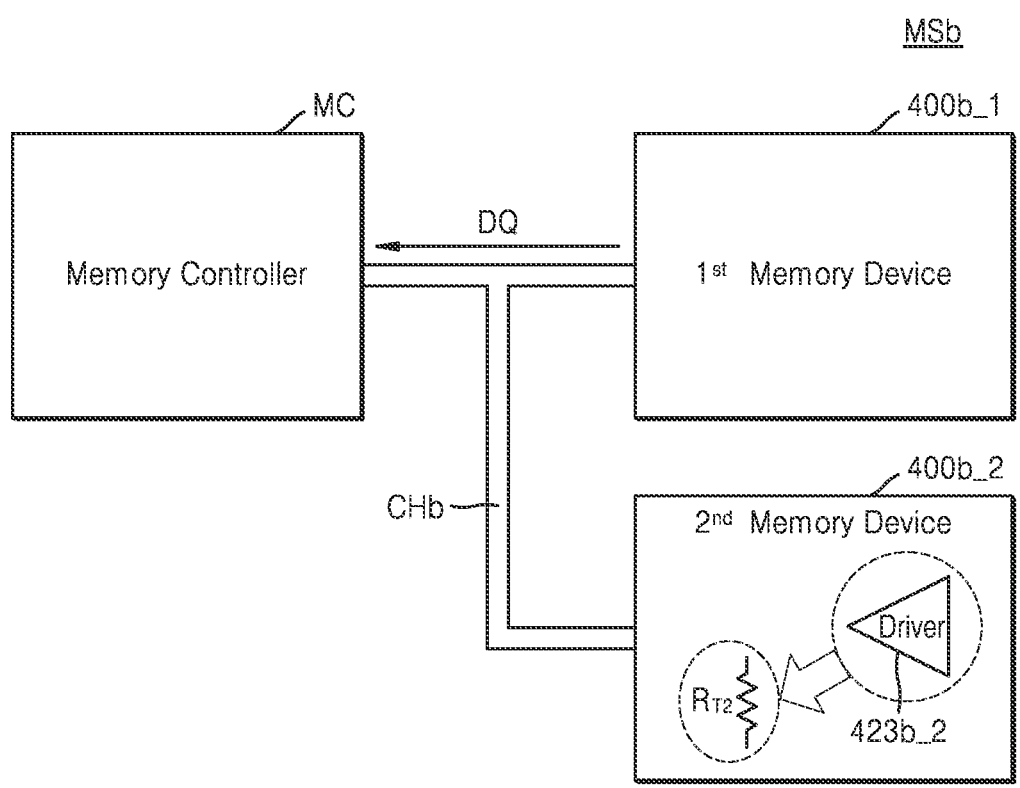
Figure 20C:
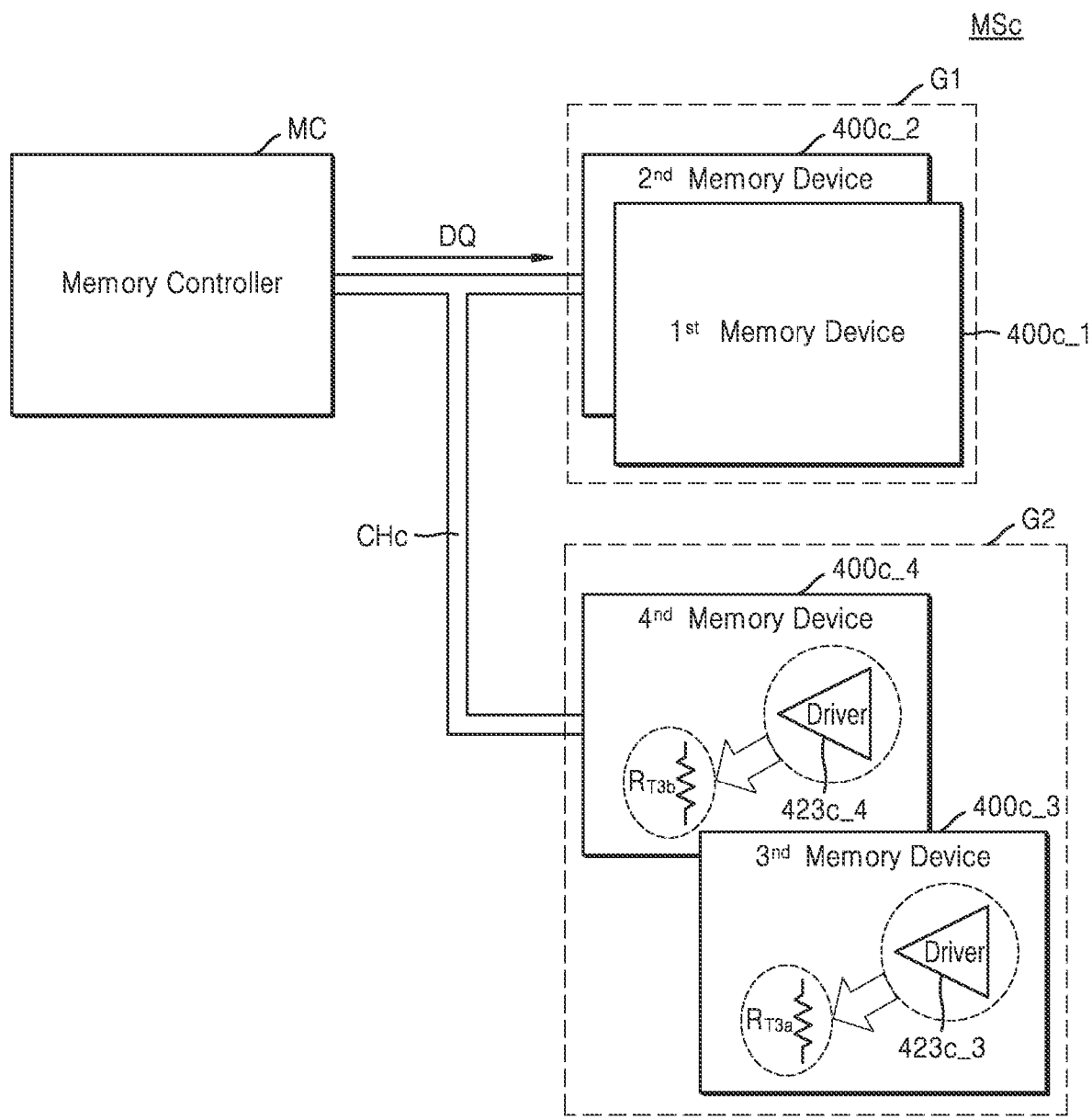

FIGS. 20A to 20C are block diagrams illustrating memory systems MSa to MSc including a transmitter 420a that performs an operation of a termination element according to an embodiment.

Referring to FIG. 20A, the memory system MSa may include a memory controller MC and a memory device 400a. The memory controller MC and the memory device 400a may be connected through a channel CHa. The memory device 400a may include the transmitter 420a and a receiver 460a, and the transmitter 420a and the receiver 460a may be connected to the channel CHa through one port 480. The transmitter 420a may include a pre-driver 422a and a driver 423a to which embodiments of the disclosure are applied.

In an embodiment, when the receiver 460a receives a signal from the memory controller MC through the channel CHa, the driver 423a may operate as a termination element RT1 of the memory device 400a. Also, the driver 423a may be controlled to have a resistance value for impedance matching with the memory controller MC.

Referring to FIG. 20B, the memory system MSb may include the memory controller MC and first and second memory devices 400b_1 and 400b_2. The memory controller MC and the first and second memory devices 400b_1 and 400b_2 may be connected through one channel CHb. When the first memory device 400b_1 provides the DQ signal DQ to the memory controller MC, a driver 423b_2 included in the second memory device 400b_2 may operate as a termination element $R_{T2}$. Also, the driver 423b_2 may be controlled to have a resistance value for impedance matching with the memory controller MC.

Referring to FIG. 20C, the memory system MSc may include the memory controller MC and first and second memory groups G1 and G2. The memory controller MC and the first and second memory groups G1 and G2 may be connected through one channel CHc. The first memory group G1 may include first and second memory devices 400c_1 and 400c_2, and the second memory group G2 may include third and fourth memory devices 400c_3 and 400c_4.

When the first memory group G1 provides the DQ signal DQ to the memory controller MC, drivers 423c_3 and 423c_4 respectively included in the third and fourth memory devices 400c_3 and 400c_4 of the second memory group G2 may operate as termination elements $R_{T3a}$ and $R_{T3b}$. Also, the drivers 423c_3 and 423c_4 may be controlled to have resistance values for impedance matching with the memory controller MC.

Figure 21:
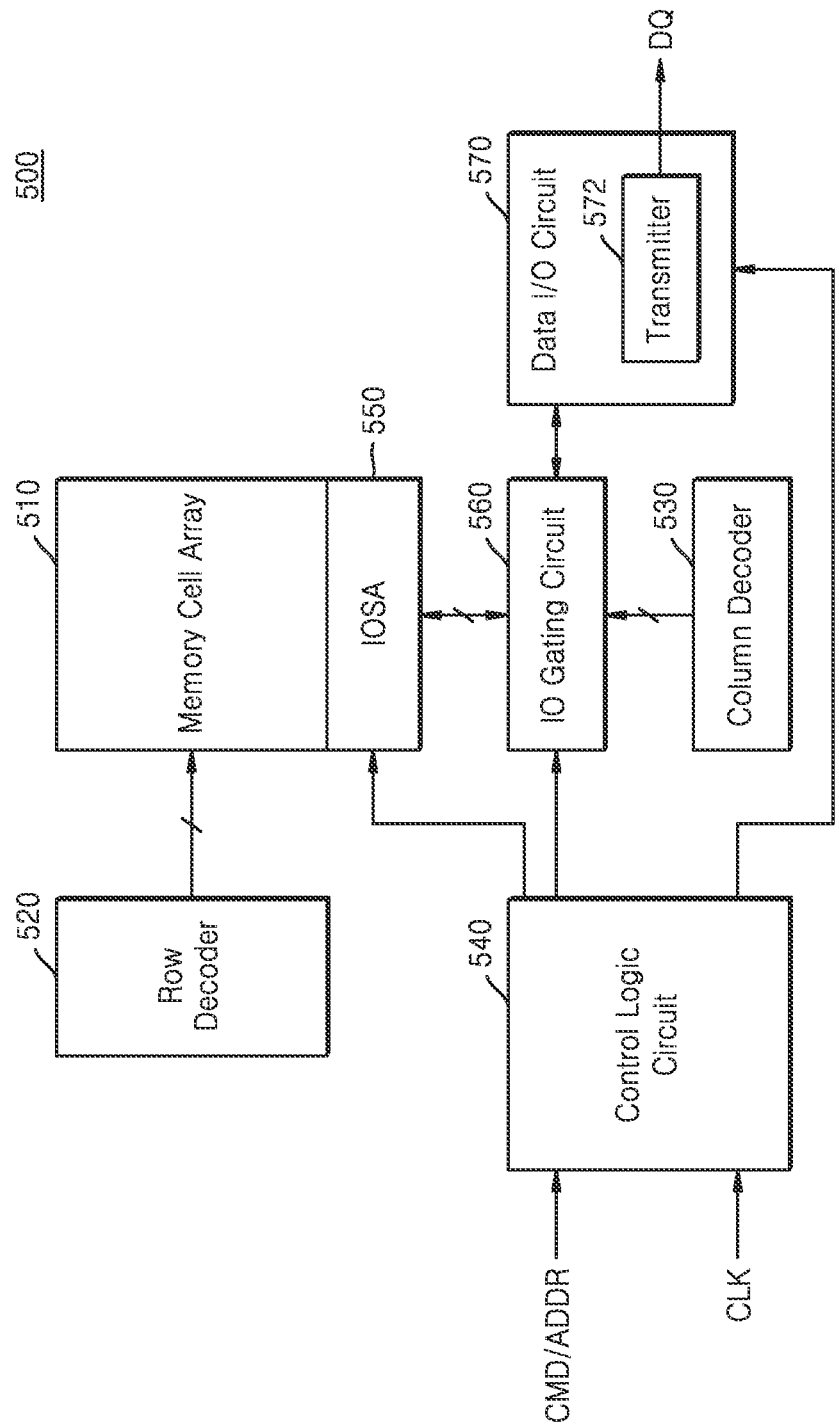
FIG. 21 is a block diagram illustrating a memory device according to an embodiment.

FIG. 21 is a block diagram illustrating a memory device 500 according to an embodiment. FIG. 21 shows an embodiment in which the memory device 500 is implemented as a DRAM device.

Referring to FIG. 21, the memory device 500 includes a memory cell array 510, a row decoder 520, a column decoder 530, a control logic circuit 540, an input/output sense amplifier 550, an input/output gating circuit 560, and a data input/output circuit 570.

The memory cell array 510 may include memory cells connected to a plurality of word lines and a plurality of bit lines, and the row decoder 520 may perform a selection operation on the word lines in response to a row address from the outside. Also, the column decoder 530 may perform a selection operation on the bit lines in response to a column address from the outside.

The control logic circuit 540 may control an overall operation inside the memory device 500. As an example, the control logic circuit 540 may control various circuit blocks inside the memory device 500 in response to a command from a memory controller.

The control logic circuit 540 may sequentially receive the command CMD and the address signal ADDR through a command/address (CA) pad (or pin). The control logic circuit 540 may decode the received command CMD to generate and provide an internal command for controlling a memory operation to the input/output sense amplifier 550 and the input/output gating circuit 560.

The data input/output circuit 570 according to an embodiment may include a transmitter 572 to which embodiments of the disclosure are applied. The transmitter 572 may be configured and operate according to the above-described embodiments to output the DQ signal DQ.

Figure 22:
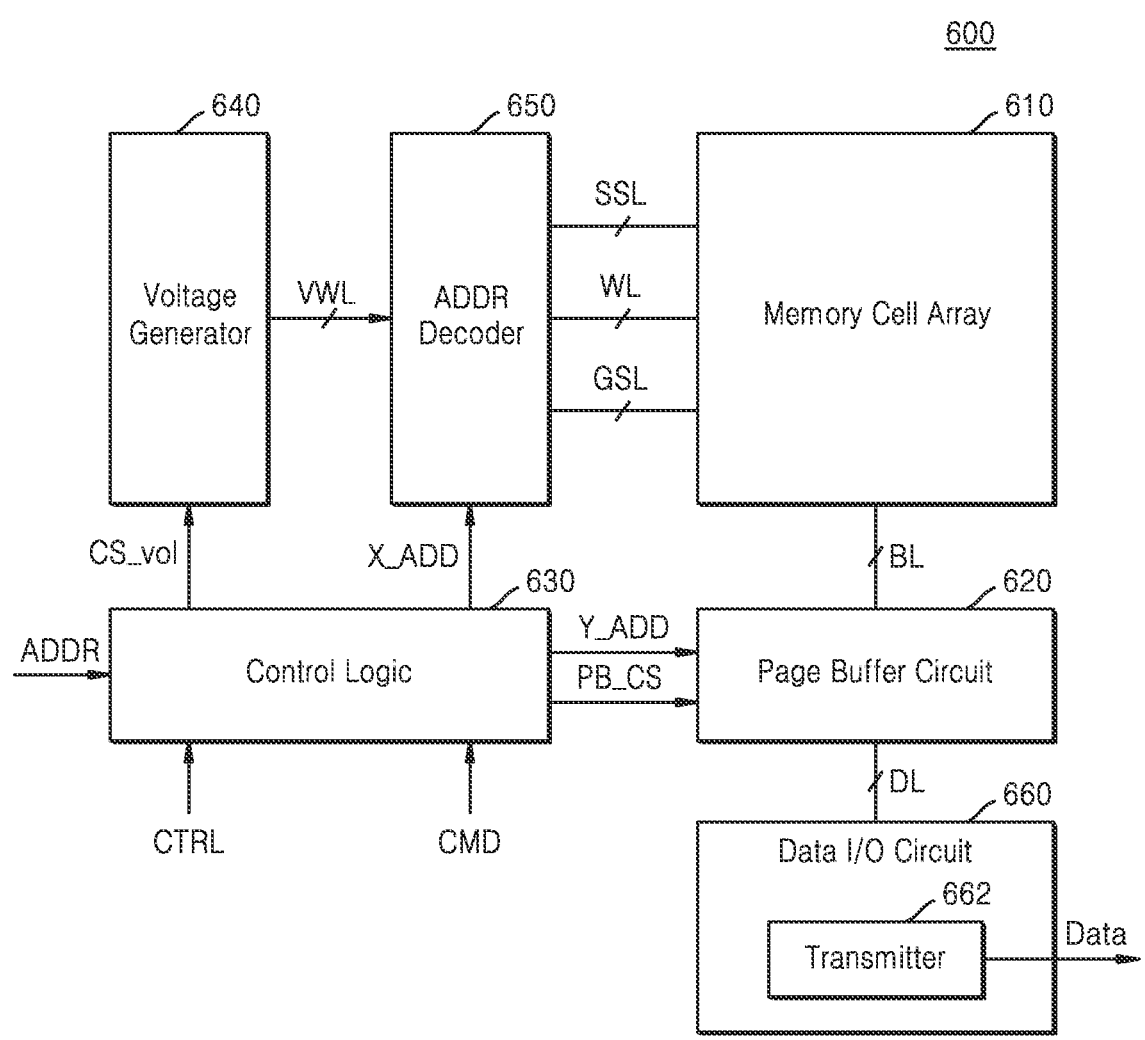
FIG. 22 is a block diagram illustrating a memory device according to an embodiment.

FIG. 22 is a block diagram illustrating a memory device 600 according to an embodiment. FIG. 22 shows an embodiment in which the memory device 600 is implemented as a flash device.

Referring to FIG. 22, the memory device 600 includes a memory cell array 610, a page buffer circuit 620, a control logic 630, a voltage generator 640, an address decoder 650, and a data input/output circuit 660.

The memory cell array 610 may include a plurality of strings (or cell strings) disposed on a substrate in row and column directions. Each of the strings may include a plurality of memory cells stacked in a direction perpendicular to the substrate. That is, the memory cells may be stacked in a direction perpendicular to the substrate to form a three-dimensional structure. Each of the memory cells may be used as a cell type such as a single level cell, a multi level cell, a triple level cell, or a quadruple level cell. The embodiment may be flexibly applied according to various cell types of a memory cell.

The memory cells of the memory cell array 610 may be connected to word lines WL, string selection lines, ground selection lines GSL, and bit lines BL. The memory cell array 610 may be connected to the address decoder 650 through the word lines WL, the string selection lines SSL, and the ground selection lines GSL, and may be connected to a page buffer 620 through the bit lines BL.

The page buffer circuit 620 may temporarily store data to be programmed into the memory cell array 610 and data read from the memory cell array 610. The page buffer circuit 620 may include a plurality of page buffers (or a plurality of latch units). As an example, each of the page buffers may include a plurality of latches corresponding to the plurality of bit lines BL, and may store data in a page unit. In some embodiments, the page buffer circuit 620 may include a sensing latch unit, and the sensing latch unit may include a plurality of sensing latches corresponding to the plurality of bit lines BL. In addition, each of the sensing latches may be connected to a sensing node through which data is sensed through a corresponding bit line.

The control logic 630 may control the overall operation of the memory device 600, and, for example, based on the command CMD, the address ADDR, and the control signal CTRL received from a memory controller, may output various internal control signals for programming data to the memory cell array 610, reading data from the memory cell array 610, or erasing data stored in the memory cell array 610.

Various internal control signals output from the control logic 630 may be provided to the page buffer circuit 620, the voltage generator 640, and the address decoder 650. Specifically, the control logic 630 may provide a voltage control signal CS_vol to the voltage generator 640. The voltage generator 640 may include one or more pumps, and the voltage generator 640 may generate voltages VWL having various levels according to a pumping operation based on the voltage control signal CS_vol. Meanwhile, the control logic 630 may provide a row address X_ADD to the address decoder 650, and provide a column address Y_ADD and a page buffer control signal PB_CS for controlling the page buffer circuit 620 to the buffer circuit 620.

The data input/output circuit 660 may include a transmitter 662 to which embodiments of the disclosure are applied. The transmitter 662 may be configured and operate according to the embodiments of the disclosure described above to output a data signal Data (or a DQ signal).

Figure 23:
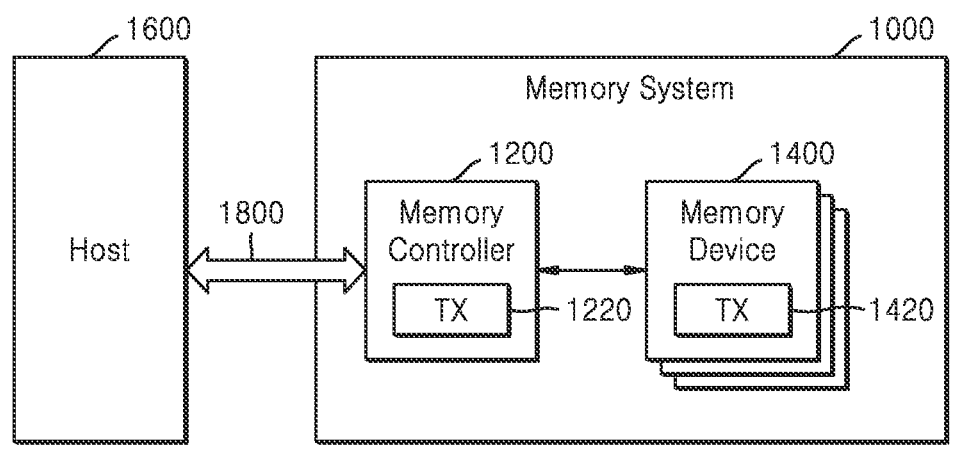
FIG. 23 is a block diagram of a system including a transmitter according to an embodiment.

FIG. 23 is a block diagram of a system including a transmitter according to an embodiment. As shown in FIG. 23, a memory system 1000 and a host system 1600 may communicate with each other via an interface 1800, and the memory system 1000 may include a memory controller 1200 and memory devices 1400.

The interface 1800 may use an electrical signal and/or an optical signal, and as a non-limiting example, the interface 1800 may be a serial advanced technology attachment (SATA) interface, a SATA express (SATAe) interface, a serial attached small computer system interface (SCSI) (SAS), a universal serial bus (USB) interface, or a combination thereof. The host system 1600 and the memory controller 1200 may each include a SerDes for serial communication.

In some embodiments, the memory system 1000 may be removably coupled to the host system 1600 to communicate with the host system 1600. The memory device 1400 may include a volatile memory or a non-volatile memory, and the memory system 1000 may be referred to as a storage system. For example, the memory system 1000 may be implemented, as a non-limiting example, as a solid-state drive or solid-state disk (SSD), an embedded SSD (eSSD), a multimedia card (MMC), an embedded multimedia card (eMMC), etc. The memory controller 1200 may control the memory devices 1400 in response to a request from the host system 1600 via the interface 1800.

Meanwhile, transmitters 1220 and 1420 to which the embodiments of the disclosure are applied, may be respectively included in the memory controller 1200 and the memory devices 1400.

Figure 24:
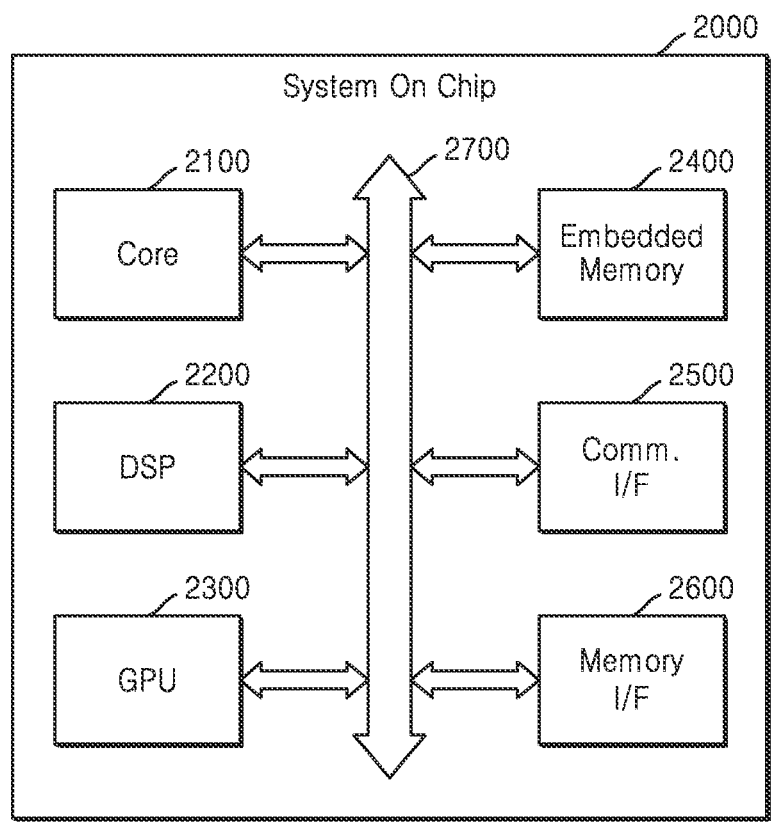
FIG. 24 is a block diagram of a system-on-chip including a memory device according to an embodiment.

FIG. 24 is a block diagram of a system-on-chip (SoC) 2000 including a memory device according to an embodiment. The SoC 2000 may denote an integrated circuit on which components of a computing system or another electronic system are integrated. For example, an application processor (AP) as one of the SoCs 2000 may include a processor and components for other functions.

As shown in FIG. 24, the SoC 2000 may include a core 2100, a digital signal processor (DSP) 2200, a graphics processing unit (GPU) 2300, an embedded memory 2400, a communication interface 2500, and a memory interface 2600. The elements of the SoC 2000 may communicate with one another via a bus 2700.

The core 2100 may process instructions and may control operations of the elements in the SoC 2000. For example, the core 2100 may drive an operating system and may execute applications on the operating system by processing a series of instructions. The DSP 2200 may generate useful data by processing a digital signal, e.g., a digital signal provided from the communication interface 2500. The GPU 2300 may generate data for an image output through a display apparatus from image data provided from the internal memory 2400 or the memory interface 2600 or may encode image data. The internal memory 2400 may store data that is required for the core 2100, the DSP 2200, and the GPU 2300 to operate. The memory interface 2600 may provide an interface about an external memory of the SoC 2000, e.g., dynamic random access memory (DRAM), flash memory, etc.

The communication interface 2500 may provide serial communication with the outside of the SoC 2000. For example, the communication interface 2500 may be connected to Ethernet and may include a SerDes for serial communication.

The configuration of the transmitter, to which one or more embodiments of the disclosure are applied, may be applied to the communication interface 2500 or the memory interface 2600.

At least one of the components, elements, modules or units (collectively "components" in this paragraph) represented by a block in the drawings may be embodied as various numbers of hardware, software and/or firmware structures that execute respective functions described above, according to an example embodiment. These components may include at least the PAM encoder 121, the pre-driver 122, the driver 123, the amplifier 221, the PAM decoder 222, the deserializer 223 and the command generator 240, as shown in FIG. 1, not being limited thereto. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosure has been particularly shown and described with reference to embodiments thereof, it will be understood that various changes in form and details may be made therein without departing from the spirit and scope of the following claims.

What is claimed is:

1. A memory device comprising:
a memory cell array; and
a transmitter,
wherein the transmitter comprises:
a pulse amplitude modulation (PAM) encoder configured to generate a first input signal based on PAM-n (where n is an integer greater than or equal to 4) from data read from the memory cell array;
a pre-driver configured to generate a second input signal based on the first input signal and based on a calibration code signal, and output the second input signal using a first power voltage; and
a driver configured to output a DQ signal based on the PAM-n using a second power voltage lower than the first power voltage in response to the second input signal,
wherein the calibration code signal comprises a plurality of codes for adjusting driving strength of each of a plurality of pull-up circuits and a plurality of pull-down circuits included in the driver.

2. The memory device of claim 1, wherein the driver comprises a plurality of pull-up circuits each comprising a plurality of first transistors; and a plurality of pull-down circuits each comprising a plurality of second transistors, and
wherein a plurality of transistors from among the plurality of first transistors and the plurality of second transistors is turned on based on the second input signal applied to gate terminals of the plurality of first transistors and the plurality of second transistors.

3. The memory device of claim 2, wherein the plurality of first transistors and the plurality of second transistors comprise nMOS transistors.

4. The memory device of claim 2, wherein the driver further comprises a plurality of additional pull-up circuits each comprising a plurality of third transistors,
wherein the pre-driver is configured to generate a third input signal based on the first input signal and based on an additional calibration code signal, and output a fourth input signal using the first power voltage, and
wherein at least one of the plurality of third transistors is turned on based on the fourth input signal applied to gate terminals of the plurality of third transistors.

5. The memory device of claim 2, wherein the driver further comprises a plurality of additional pull-down circuits each comprising a plurality of third transistors,
wherein the pre-driver is configured to generate a third input signal based on the first input signal and based on an additional calibration code signal, and output a fourth input signal using the first power voltage, and
wherein at least one of the plurality of third transistors is turned on based on the fourth input signal applied to gate terminals of the plurality of third transistors.

6. The memory device of claim 1, wherein a swing period of the DQ signal is based on a type of a termination element of a memory controller receiving the DQ signal through a channel.

7. The memory device of claim 1, further comprising:
a calibration circuit comprising a replica circuit of a same configuration as a configuration of the driver, the calibration circuit being configured to generate the calibration code signal using the replica circuit so that the DQ signal has a certain level separation mismatch ratio.

8. The memory device of claim 7, wherein the calibration circuit is configured to generate the calibration code signal according to a type of a termination element of a memory controller receiving the DQ signal through a channel.

9. The memory device of claim 1, further comprising a receiver,
wherein the driver is configured to operate as a termination element of the memory device when the receiver receives a signal from a memory controller through a channel.

10. The memory device of claim 1, wherein the transmitter is configured to support a PAM-n signaling mode and a non-return zero (NRZ) signaling mode, and
wherein the transmitter is configured to operate in any one of the PAM-n signaling mode and the NRZ signaling mode based on a signaling mode of the memory device.

11. The memory device of claim 1, wherein the memory device is configured to receive a mode register set signal comprising at least one of a first setting signal indicating a type of a termination element of a memory controller and a second setting signal for setting a signaling mode of the memory device, and output the DQ signal based on the mode register set signal.

12. A memory device comprising:
a memory cell array; and
a transmitter,
wherein the transmitter comprises:
a pulse amplitude modulation (PAM) encoder configured to generate a first most significant bit (MSB) signal and a second MSB signal in accordance with a PAM-4 and generate a first least significant bit (LSB) signal and a second LSB signal from data read from the memory cell array;
a pre-driver configured to, in a first voltage domain, generate a third MSB signal based on the first MSB signal and a first pull-up code, a fourth MSB signal based on the second MSB signal and a second pull-up code, a third LSB signal based on the first LSB signal and a first pull-down code, and a fourth LSB signal based on the second LSB signal and a second pull-down code; and
a driver comprising a first pull-up circuit activated by the third MSB signal and configured to adjust a driving strength by the third MSB signal, a first pull-down circuit activated by the fourth MSB signal and configured to adjust the driving strength based on the fourth MSB signal, a second pull-up circuit activated by the third LSB signal and configured to adjust the driving strength based on the third LSB signal, and a second pull-down circuit activated by the fourth LSB signal and configured to adjust the driving strength based on the fourth LSB signal, and configured to output a DQ signal based on the PAM-4 using the first pull-up circuit, the second pull-up circuit, the first pull-down circuit, and the second pull-down circuit in a second voltage domain.

13. The memory device of claim 12, wherein the second voltage domain is lower than the first voltage domain.

14. The memory device of claim 12, wherein the driver further comprises a first additional circuit and a second additional circuit configured to adjust sizes of intermediate levels between a maximum level of the DQ signal and a minimum level of the DQ signal.

15. The memory device of claim 12, wherein a swing period of the DQ signal is based on a type of a termination element of a memory controller receiving the DQ signal through a channel.

16. The memory device of claim 12, wherein the driver is configured to output the DQ signal based on the PAM-4 or output a different DQ signal based on a non-return zero (NRZ) according to a signaling mode set by a memory controller.

17. The memory device of claim 12, further comprising a receiver,
wherein the driver is configured to operate as a termination element of the memory device when the receiver receives a signal from a memory controller through a channel.

18. A memory system comprising:
a memory controller; and
a plurality of memory devices connected to the memory controller through one channel,
wherein each of the plurality of memory devices comprises:
 a transmitter comprising a pulse amplitude modulation (PAM) encoder configured to generate a first input signal in accordance with a PAM-n (where n is an integer greater than or equal to 4) from data requested by the memory controller;
 a pre-driver configured to generate a second input signal based on the first input signal and based on a calibration code signal, and output the second input signal using a first power voltage; and
 a driver configured to output a DQ signal based on the PAM-n using a second power voltage lower than the first power voltage in response to the second input signal,
wherein the calibration code signal comprises a plurality of codes for adjusting driving strength of each of a plurality of pull-up circuits and a plurality of pull-down circuits included in the driver.

19. The memory system of claim 18, wherein the driver included in at least one of the plurality of memory devices is configured to operate as a termination element.

* * * * *